United States Patent [19]
New et al.

[11] Patent Number: 5,546,018
[45] Date of Patent: Aug. 13, 1996

[54] FAST CARRY STRUCTURE WITH SYNCHRONOUS INPUT

[75] Inventors: Bernard I. New, Los Gatos; Steven P. Young, San Jose, both of Calif.

[73] Assignee: Xilinx, Inc., San Jose, Calif.

[21] Appl. No.: 513,365

[22] Filed: Aug. 9, 1995

Related U.S. Application Data

[63] Continuation-in-part of Ser. No. 310,113, Sep. 20, 1994, Pat. No. 5,481,206, which is a continuation-in-part of Ser. No. 116,659, Sep. 2, 1993, Pat. No. 5,349,250.

[51] Int. Cl.$^6$ .................................................. H03K 19/20
[52] U.S. Cl. ............................... 326/38; 326/39; 326/40; 326/41; 365/189.08
[58] Field of Search .................... 326/38, 39, 40–41; 327/407; 365/189.08

[56] References Cited

U.S. PATENT DOCUMENTS

| | | | |
|---|---|---|---|
| 4,124,899 | 11/1978 | Birkner et al. | 364/716 |
| 4,706,216 | 11/1987 | Carter | 365/94 |
| 4,758,745 | 7/1988 | Elgamal et al. | 307/465 |
| 4,870,302 | 9/1989 | Freeman | 307/465 |
| 5,198,705 | 3/1993 | Galbraith et al. | 307/465 |
| 5,258,668 | 11/1993 | Cliff et al. | 307/465 |
| 5,260,611 | 11/1993 | Cliff et al. | 307/465 |
| 5,267,187 | 11/1993 | Hsieh et al. | 364/784 |
| 5,280,202 | 1/1994 | Chan et al. | 307/465 |
| 5,287,472 | 2/1994 | Horst | 365/189 |
| 5,317,210 | 5/1994 | Patel | 326/40 |
| 5,332,929 | 7/1994 | Chiang | 365/189 |
| 5,343,406 | 8/1994 | Freeman et al. | 364/490 |
| 5,349,250 | 9/1994 | New | 307/465 |
| 5,352,940 | 10/1994 | Watson | 365/189 |
| 5,396,127 | 3/1995 | Chan | 326/40 |
| 5,414,377 | 5/1995 | Freidin | 326/41 |
| 5,451,887 | 9/1995 | El-Ayat | 326/39 |

FOREIGN PATENT DOCUMENTS

| | | | |
|---|---|---|---|
| 0456475A2 | 11/1991 | European Pat. Off. | G06F 7/50 |
| 0607657A1 | 7/1994 | European Pat. Off. | H03K 19/173 |

OTHER PUBLICATIONS

Xilinx Programmable Gate Array Data Book, 1989, pp. 6–30 through 6–44, available from Xilinx, Inc., 2100 Logic Drive, San Jose, California 95124.

C. Lytle "FLEX Programmable Logic: Largest Density PLD", COMPCON Spring '93, Digest of Papers, Feb. 22–26 1993, IEEE, Computer Society Press, New York, pp. 355–361.

*Primary Examiner*—David C. Nelms
*Assistant Examiner*—Son Mai
*Attorney, Agent, or Firm*—Edel M. Young

[57] ABSTRACT

Programmable logic devices which include multiple blocks of combinatorial function generators and storage elements, and which are interconnected by a programmable interconnect structure are used, among other things for performing arithmetic functions which use logic for generating the carry function. When a large number of bits is to be processed, the carry function typically causes significant delay or requires significant additional components to achieve a result at high speed. The present invention provides dedicated hardware within the logic blocks for performing the carry function quickly and with a minimum number of components. The circuit includes additional structures to allow the fast carry hardware to perform additional commonly used functions. In some embodiments, the circuit also includes structures which allow efficient implementation of a loadable counter and related applications.

3 Claims, 23 Drawing Sheets

Schematic Symbol For Full Adder

|   | A | B | C_IN | C_OUT |
|---|---|---|------|-------|
| 1 | 0 | 0 | 0 | 0 |
| 2 | 0 | 0 | 1 | 0 |
| 3 | 0 | 1 | 0 | 0 |
| 4 | 1 | 0 | 0 | 0 |
| 5 | 0 | 1 | 1 | 1 |
| 6 | 1 | 0 | 1 | 1 |
| 7 | 1 | 1 | 0 | 1 |
| 8 | 1 | 1 | 1 | 1 |

| NW | N | N | N | N | N | N | N | N | NE |
|----|---|---|---|---|---|---|---|---|----|
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| W | C | C | C | C | C | C | C | C | E |
| SW | S | S | S | S | S | S | S | S | SE |

FAST CARRY STRUCTURE WITH SYNCHRONOUS INPUT

CONTINUATION INFORMATION

This is a continuation-in-part of U.S. patent application Ser. No. 08/310,113 filed Sep. 20, 1994, issued as U.S. Pat. No. 5,481,206, which is a continuation-in-part of U.S. patent application Ser. No. 08/116,659 filed Sep. 2, 1993, issued as U.S. Pat. No. 5,349,250 on Sep. 20, 1994.

FIELD OF THE INVENTION

This invention relates to large integrated circuits, more particularly to programmable or configurable logic devices.

BACKGROUND

One kind of function performed in programmable logic devices is arithmetic. A device such as a configurable logic array of Xilinx, Inc., assignee of the present invention, can perform arithmetic as well as a multitude of other logic functions. Such devices are described in U.S. Pat. Nos. 4,870,302 and 4,706,216, and U.S. patent application Ser. No. 07/387,566, which are incorporated herein by reference. Because these devices are intended for general purpose functions, arithmetic is relatively slow and requires a significant amount of silicon area.

Other programmable logic devices, such as the programmable array logic device described in Birkner, U.S. Pat. No. 4,124,899 and user programmable devices described in Elgamal et al, U.S. Pat. No. 4,758,745 can also be programmed to perform arithmetic. These two patents are also incorporated by reference. In these devices the speed of performing arithmetic and other functions which use carry logic is limited by propagation of the carry signal. Also, the general purpose logic used to implement the carry function is significant.

For understanding how logic devices perform arithmetic, and particularly what causes delay, the following discussion of arithmetic functions will focus on adders. However, the discussion can easily be extended to apply to subtractors, incrementers, decrementers, and accumulators, in addition to other circuits which use carry-logic.

The following discussion will focus on operation of the middle stages in a multi-bit adder. The least significant bit is a special case because there can be no carry signal to be received from a less significant bit. The most significant bit is a special case because the carry bit can be used for determining an overflow condition. These two special cases will be discussed in detail later.

By reference to FIGS. 1a, 1b and 2, it will be explained how the speed of a single-bit ripple-carry adder (FIGS. 1a and 1b), and thus a multi-bit ripple-carry adder constructed by cascading single-bit adders (FIG. 2) is constrained by the speed at which the signal at the carry-in terminal is propagated to the carry-out terminal.

The Boolean logic equations governing the behavior of the single-bit adder shown in FIG. 1a are:

$$S_i = (A_i @ B_i) @ C_i \quad (1)$$

$$C_{i+1} = A_i \cdot B_i + (A_i @ B_i) \cdot C_i \quad (2)$$

where
@ represents the exclusive-or (XOR) function,
· represents the AND function, and
+ represents the OR function.

Eq. (1) shows that the sum is a function of a carry-in from a less significant bit in addition to the single bits $A_i$ and $B_i$ being added. The ripple carry adder algorithm of Eqs. (1) and (2) shows that the sum for a particular bit cannot be calculated until the carry-out from the previous bit is available. The sum $S_i$ is the output of an XOR gate and cannot be generated until each of its inputs, one of which is the carry-in signal $C_i$, is available.

Furthermore, the carry-out $C_{i+1}$ also cannot be generated until the less significant carry bit $C_i$ is available. Referring now to FIG. 2, the propagation of the carry signal through successive stages of a ripple carry adder will be explained. AND gate 67 in the second adder stage $Add_{i+1}$ receives one of its inputs from the output of XOR gate 66 after only 1 gate delay. However, assuming that the carry-in signal $C_i$ is preset (that is, that $Add_i$ is the least significant bit), AND gate 67 could wait an additional 3 gate delays for the effect of $A_i$ and $B_i$ to propagate through gates 61, 62 and 65 before its other input, the carry-out $C_{i+1}$ from the less significant bit, has been generated from the carry-out of the less significant bit $C_i$ and the less significant bits $A_i$ and $B_i$ to be added. Furthermore, the carry-out $C_{i+2}$ of the second bit $Add_{i+1}$ is further delayed through 2 more gates after the carry bit $C_{i+1}$ has been generated. That is, combining the inputs on $A_{i+1}$ and $B_{i+1}$ with the carry-in signal $C_{i+1}$ to generate $C_{i+2}$ requires that $C_{i+1}$ propagate through AND gate 67 and OR gate 70. Thus, there will not be a valid carry-in signal $C_{i+2}$ for input to a third stage until 5 gate delays after the application of the input signals $A_i$ and $B_i$. Thus, the speed of the conventional ripple carry adder is constrained by the speed of propagation of the carry signal. The propagation delay of a conventional ripple carry adder is 2n+1 gates where n is the number of stages in the multi-bit adder.

Since addition is the foundation of many other important functions and operations, it has been important to the computer industry to devise faster adder circuits by speeding up the carry propagation time. In general, these methods work by trading component density and complexity for carry propagation speed.

One well-known algorithm which achieves a faster carry propagation speed is called look-ahead carry logic. A circuit for implementing look-ahead carry logic is shown in FIG. 3. Understanding this logic requires the introduction of two new variables:

$$P_i = A_i @ B_i \quad (3)$$

$$G_i = A_i \cdot B_i \quad (4)$$

The variable P is called "carry propagate" because when P is high, carry-in is propagated to carry-out. The variable G is called "carry generate" because when G is high, a carry-out is generated by the bits being added.

Eqs. (1) and (2) can be rewritten in terms of these new variables:

$$S_i = P_i @ C_i \quad (5)$$

$$C_{i+1} = G_i + P_i \cdot C_i \quad (6)$$

With some minor algebraic manipulation, Eq. (6) can be used to write new equations where the carry bit at each level is dependent only on the addends at each level and the least significant carry bit. The following equations are implemented in the four-bit adder shown in FIG. 3:

$$C_1 = A_0 \cdot B_0 = G_0 \tag{7) (a}$$

$$C_2 = G_1 + P_1 \cdot C_1 = G_1 + P_1 \cdot C_1 \tag{b}$$

$$C_3 = G_2 + P_2 \cdot C_2 = G2 + P_2 \cdot (G_1 + P_1 C_1) = G_2 + P_2 \cdot G_1 + P_2 \cdot P_1 \cdot C_1 \tag{c}$$

$$C_4 = G_3 + P_3 \cdot C_3 = G_3 + P_3 \cdot (G_2 + P_2 \cdot G_1 + P_2 \cdot P_1 \cdot C_1) = G_3 + P_3 \cdot G_2 + P_3 \cdot P_2 \cdot G_1 + P_3 \cdot P_2 \cdot P_1 \cdot C_1 \tag{d}$$

Each $G_i$ and $P_i$ is a function only of $A_i$ and $B_i$ and not of previous carry values, as can be seen in Eqs. 3 and 4. Second, note in Eq. 7b that $C_2$ is calculated as a function of $G_1$, $P_1$, and $C_1$, and that in Eq. 7c, $C_3$ is calculated as a function of $G_2$, $P_2$ and $C_2$. But since $C_2$ has been solved in terms of $C_1$, $C_3$ can also be solved in terms of $C_1$. Attention to Eq. 7d, and the more general Eq. 6 will reveal that each $C_{i+1}$ is a function of several $G_i$'s, $P_i$'s, and $C_1$. As can be seen in FIG. 3, the less significant bit is fed into the next significant bit only for the calculation of the sum, not for the calculation of the carry bit. Since each carry bit is a function of several $G_i$'s, $P_i$'s, and $C_1$, each carry bit is not dependent on the carry-out of any but the least significant bit. Thus the carry propagation delay of the look-ahead carry circuit is independent of the number of bits being added.

Referring still to FIG. 3 and FIG. 1a, the delay from the application of the input signals (A's and B's) to the appearance of a valid signal at the generate outputs ($G_i$'s) and propagate outputs ($P_i$'s) of an adder stage is 1 gate (this can be discerned from FIG. 1a). The delay added in FIG. 3 by the carry restorer portion of the look ahead carry circuitry is 2 gates, which makes a total of a 3-gate delay from the application of the input signals to the adder until the last carry-out bit is available. This relationship is independent of the number of bits being added. For a multibit adder circuit, the delay will be significantly less than the delay of a conventional ripple carry adder circuit. However, as the number of stages is increased, the number of components increases significantly. Look ahead carry logic requires many more components than the conventional ripple carry adder to implement a stage of a multi-bit adder. This illustrates the idea that faster carry-propagation requires higher component density and many interconnect lines for routing signals.

FIG. 4 shows another example of circuit components for implementing an adder. The adder of FIG. 4 is very fast, but, like the adder of FIG. 3, uses many components. Again, a faster carry logic requires a higher component density.

Pages 6—30 through 6–44 of Xilinx, Inc., "The Programmable Gate Array Data Book," copyright 1989, available from Xilinx, Inc., 2100 Logic Drive, San Jose, Calif. 95124, show a variety-of adders and counters which can be implemented in prior art Xilinx programmable logic devices. These pages of the Xilinx data book are incorporated herein by reference. Xilinx, Inc., owner of the copyright, has no objection to copying these pages but otherwise reserves all copyright rights whatsoever. The adder of FIG. 4 is shown on page 6–30 of the Xilinx data book. FIG. 5 shows a counter, also shown on page 6–34 of the Xilinx data book. FIGS. 4 and 5 thus show applications of arithmetic functions performed in early Xilinx devices. In early Xilinx devices, calculating the sum requires one function generator, and calculating the carry function requires another function generator. Typically, two function generators are incorporated in one logic block of a Xilinx prior art configurable logic array.

Thus, in the adder circuits of both FIG. 4 and FIG. 5, and for other Xilinx prior art adder circuits as well, at least two function generators are required for implementing each stage of an adder or counter.

The truth table in FIG. 6c shows the logical relationships between two single bits that are being added, the carry-in bit, and the carry-out bit. A careful analysis of this truth table has revealed a useful pattern. When A and B are equal (lines 1,2, 7, and 8), the value of the carry-out $C_{out}$ bit is the value of A and of B. When A and B are not equal, on the other hand, (lines 3–6), the value of the carry-out $C_{out}$ bit is the value of the carry-in $C_{in}$ bit. Two equivalent Boolean logic equations can represent this pattern:

$$C_{out} = (A \oplus B) \cdot (C_{in}) + \overline{(A \oplus B)} \cdot A \tag{10}$$

$$C_{out} = (A \oplus B) \cdot (C_{in}) + \overline{(A \oplus B)} \cdot B \tag{11}$$

The circuit in FIG. 6a implements equation (10). Two conditions are satisfied by this circuit. When A and B are not equal, the signal on the carry-in terminal is passed to the carry-out terminal and when A and B are equal, the signal on A is passed to the carry-out terminal. As shown in FIG. 6a, the two single bits being added, A and B, are applied to the two input terminals of XOR gate 51. If A and B are equal, a low output signal from XOR gate 51 turns on pass transistor T1 and turns off pass transistor T2, allowing passage of the signal from A to the carry-out terminal $C_{out}$. If A and B are not equal, the output of XOR gate 51 is high, which turns on pass transistor T2 and turns off pass transistor T1. This in turn allows passage of the signal on the carry-in terminal $C_{in}$ to the carry-out terminal $C_{out}$.

FIG. 7a shows a full adder. FIGS. 6b and 7b show alternative representations of the circuits of FIGS. 6a and 7a respectively. The inverter and transistors of FIGS. 6a and 7a are represented as a multiplexer M in the illustrations of FIGS. 6b and 7b.

It will now be shown by comparing FIG. 2 and FIG. 7a that the fast carry logic described above provides faster propagation of the carry signal than a conventional ripple carry adder. FIG. 7a shows one stage of a full adder circuit. The carry propagation is controlled as discussed above in connection with FIG. 6a. As discussed above and shown in FIG. 2, the propagation delay of a conventional ripple carry adder is 1 AND gate plus 1 OR gate per pair of bits added plus 1 XOR gate. By contrast, as shown in FIG. 7a, the worst-case delay of a circuit according to the invention occurs when one of the input signals, in this case $B_i$, is propagated to the carry-out signal, that is, when the signal propagates through XOR gate 91 plus inverter 92 to turn on the pass-transistor 93. This happens simultaneously for all bits being added. The propagation delay for a carry signal to propagate through a long series of transistors such as transistor 94 adds only minimal time compared to a gate delay for generating the result of an addition. If four full-adder circuits such as shown in FIG. 7a are cascaded, in the worst case the output signal $C_{out}$ is available after an XOR gate delay plus an inverter delay plus the very small propagation delay through four pass transistors.

SUMMARY OF THE INVENTION

According to the present invention, a programmable logic device having configurable logic blocks is provided with a circuit for implementing fast carry logic. The fast carry logic circuit is useful when implementing adders, subtractors, counters, accumulators, wide AND and OR functions, decoders, and other functions that use carry logic. The fast carry path is realized in dedicated hardware and dedicated interconnect circuitry within a configurable logic array, while a carry propagate signal used to generate the carry signal is implemented in programmable function generators. This dedicated carry path circuitry allows high speed propagation of the carry signal, and high density of logic functions that use carry logic. The carry propagate signal is also used to generate the sum. Several embodiments are described, one in which the sum is computed in a programmable function generator, one in which a dedicated XOR gate provides the sum, one in which hardware for generating the carry propagate signal can also generate other logic functions, one which includes feedback paths which can implement a loadable counter efficiently, and one which can implement both a loadable counter and other functions efficiently.

In one embodiment, a circuit using carry logic is about four times as fast as the prior art, can be realized with about one-half the number of logic blocks, and leaves general purpose logic resources free for other functions. One embodiment also allows for adding or subtracting a constant to a variable without using interconnect circuitry for providing the constant.

The invention takes advantage of a Boolean functional simplification of one of two logically equivalent carry functions:

$$C_{i+1}=(A_i @ B_i)\cdot(C_i)+(A_i @ B_i)\cdot B_i \quad (8)$$

$$C_{i+1}=(A_i @ B_i)\cdot(C_i)+(A_i @ B_i)\cdot A_i \quad (9)$$

The fast carry path receives the above $C_i$ function and generates the above $C_{i+1}$ function. The XOR functions of $A_i$ and $B_i$ in the above equations are generated by look-up table function generators. The carry path is implemented in an array, with the carry-out of one bit connected to the carry-in of the next bit. Thus a high speed carry path is achieved. In one embodiment, an XOR gate is also provided so that the sum function $S_i$ can be completed without requiring more than one function generator for one bit.

When the carry logic hardware is incorporated in a configurable logic array in conjunction with general purpose logic blocks, the fast carry logic circuits preferably have a dedicated interconnect structure between carry inputs and carry outputs of adjacent logic blocks which further increases the performance.

The carry logic hardware can include additional structures such as multiplexers so that the multiplexers which generate a carry signal can also generate combinational logic functions as well.

In an embodiment especially useful for loadable counters, the Q output signal from a flip flop in the counter chain is fed back through a multiplexer which controls the carry chain and also as an input to an XOR gate which generates the sum. The sum is multiplexed with one or more of the function generator input signals in a function generator which is part of the logic block, and the output of the function generator becomes the D input to the flip flop on the next clock cycle. In another embodiment also useful for loadable counters, the Q output signal from the flip flop is fed through the multiplexer which controls the carry chain and also through general interconnect to the function generator, which is configured to implement both the sum function and the counter loading.

BRIEF DESCRIPTION OF THE DRAWINGS

FIG. 1b is a schematic symbol for the conventional full-adder stage shown in FIG. 1a.

FIG. 6a is a schematic diagram of a circuit providing one bit of carry logic according to the present invention. FIG. 6b shows an alternative representation of the circuit of FIG. 6a.

FIG. 6c is a truth-table for displaying the relationship between the variables A, B, $C_{in}$ and $C_{out}$.

FIG. 7b shows an alternative representation of the circuit of FIG. 7a.

FIG. 9e represents an FPGA chip comprising core tiles such as shown in FIG. 9c and edge and corner tiles for connecting off chip.

DETAILED DESCRIPTION

Figure 8A:
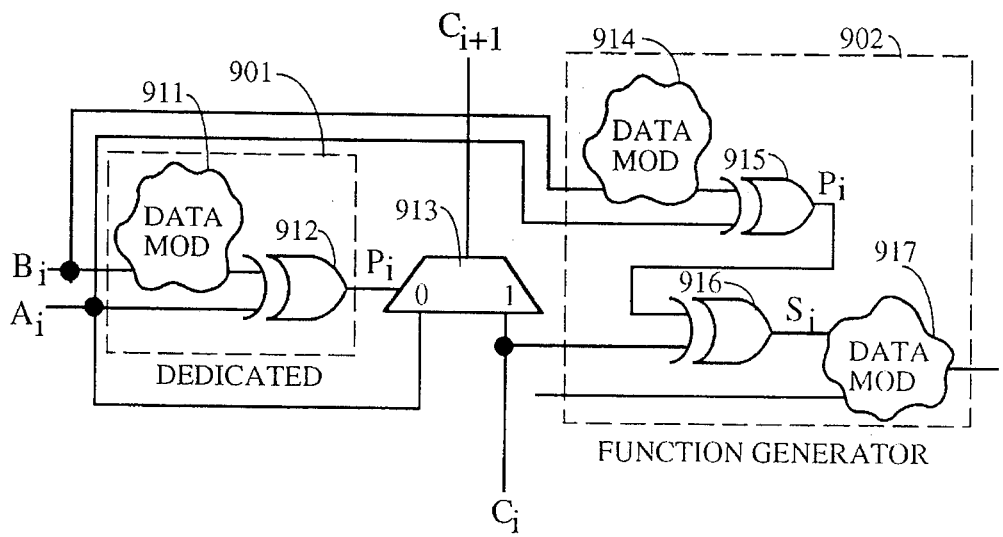
FIG. 8a shows a simplified diagram of the arithmetic portion of the carry logic used in the Xilinx, Inc. XC4000 family of devices.
Figure 8B:
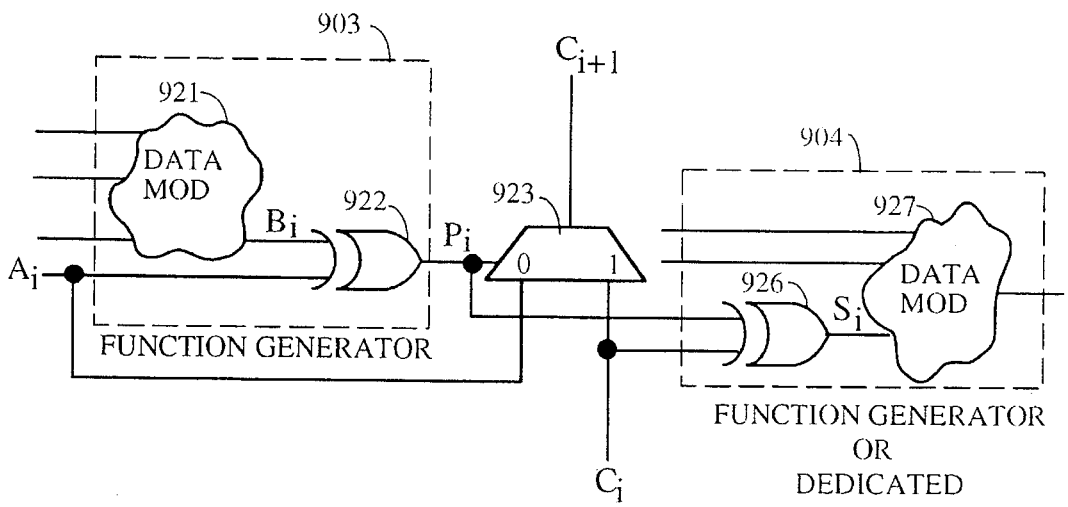
FIG. 8b shows a simplified diagram of the arithmetic portion of the carry logic in accordance with the invention.

FIG. 8a illustrates a prior art circuit for implementing carry logic in a configurable logic block. FIG. 8b illustrates a circuit according to the present invention. According to the invention, the arithmetic logic is implemented in a combination of programmable devices and hardware. As in the prior art device, the carry path is implemented by hardware in order to achieve high speed, comprising MUX 913 in FIG. 8a and MUX 923 in FIG. 8b. As shown in FIG. 8a, data modification function 911 and XOR gate 912 for receiving input signals are also implemented in dedicated hardware while additional data modification functions 914 and 917 and XOR gates 915 and 916 used for computing the sum are implemented in programmable function generator 902.

In FIG. 8b, data modification circuitry 921 and XOR gate 922 are implemented in function generator 903 while XOR gate 926 for calculating the sum is implemented in unit 904 which is either a programmable function generator or a dedicated XOR gate.

Figure 8C:
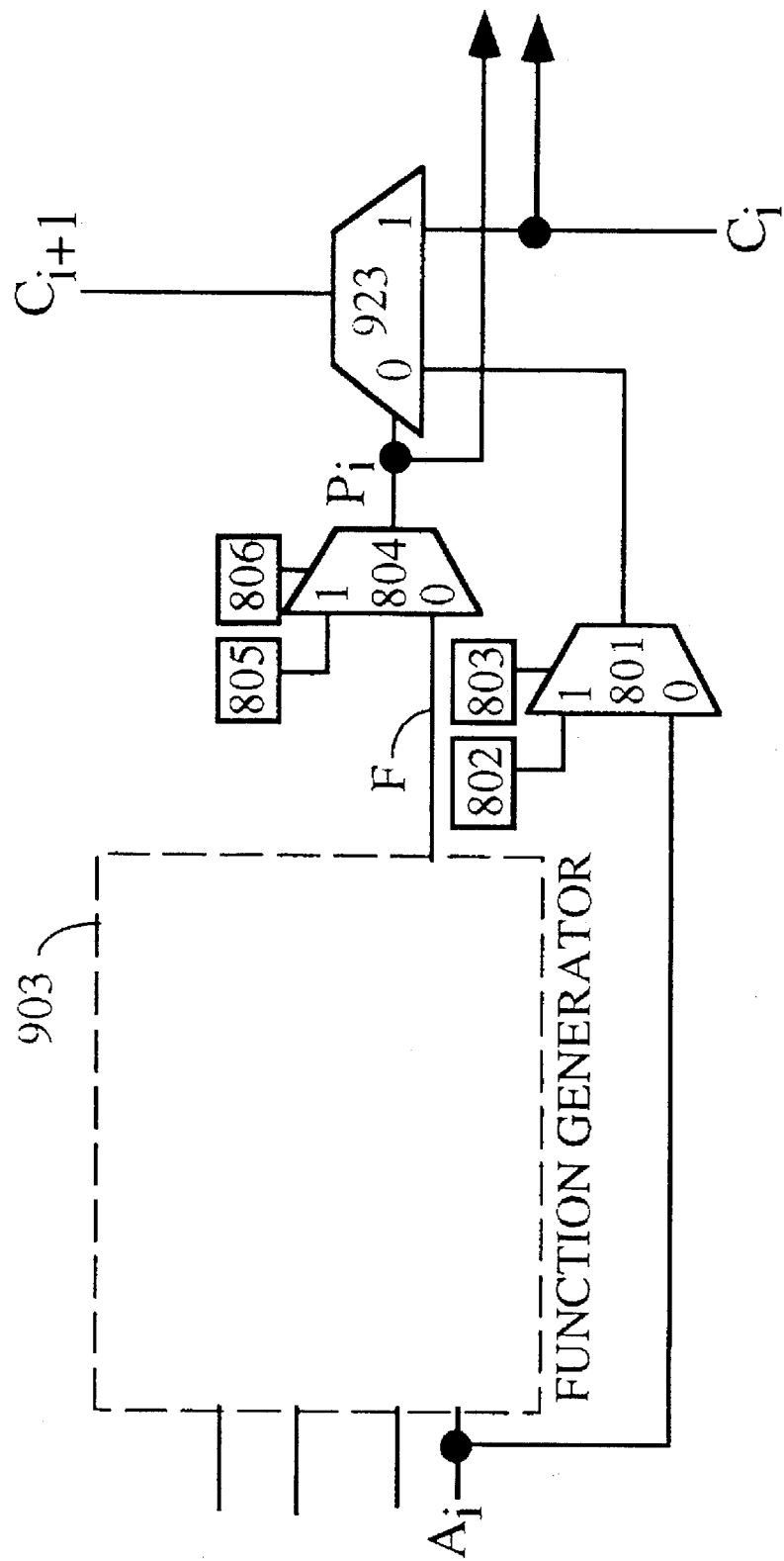
FIG. 8c shows a carry logic circuit which can also generate other logic functions.

FIG. 8c illustrates another circuit according to the present invention which can implement fast carry logic as in FIG. 8b and can alternatively implement several frequently used logic functions. Multiplexers 801 and 804 allow the user to select between forwarding signals as in FIG. 8b and providing a constant zero or one to an input and the control terminal respectively of carry multiplexer 923. Memory cells 803 and 806 control multiplexers 801 and 804 respectively to make these selections. When multiplexers 801 and 804 are forwarding, respectively, the $A_i$ signal and the F output of function generator 903, the structure of FIG. 8c operates as that of FIG. 8b. In FIG. 8c, multiplexers 801 and 804 allow a user to select between the functions provided by FIG. 8b and other combinatorial functions, as illustrated in TABLE I. Multiplexer 804 allows function generator 903 to be used independently of the carry chain when the carry chain is being used to skip or initiate an operation.

TABLE I

| | 806 | 805 | 803 | 802 | $A_i$ | Function |
|---|---|---|---|---|---|---|
| 1) | 1 | 0 | 1 | 0 | x | $C_{i+1} = 0$ |
| 2) | 1 | 0 | 1 | 1 | x | $C_{i+1} = 1$ |
| 3) | 1 | 0 | 0 | x | $A_i$ | $C_{i+1} = A_i$ |
| 4) | 1 | 1 | x | x | x | $C_{i+1} = C_i$ |
| 5) | 0 | x | 1 | 0 | x | $C_{i+1} = C_i$ AND $F_i$ |
| 6) | 0 | x | 1 | 1 | x | $C_{i+1} = C_i$ OR $\bar{F}_i$ |
| 7) | 0 | x | 0 | x | $A_i$ | Adder operation (as in FIG. 8b) |
| 8) | 0 | x | 0 | x | 0 | $C_{i+1} = C_i$ AND $F_i$ |
| 9) | 0 | x | 0 | x | 1 | $C_{i+1} = C_i$ OR $\bar{F}_i$ |

The functions in TABLE I are all commonly used functions. The addition of the two multiplexers 801 and 804 with their controlling memory cells 802, 803, 805, and 806 increases the power of the structure of FIG. 8b with very little increase in chip area.

Multiplexer 804 allows a choice between three modes. For arithmetic, multiplexer 804 provides the F output of function generator 903 (while function generator 903 is programmed as shown in FIG. 8b). Multiplexer 804 can also be programmed to provide a constant signal from memory cell 805.

A logic 0 in cell 805 causes multiplexer 923 to take its input from multiplexer 801. Thus a constant signal provided by memory cell 802 can be provided to initiate a carry operation. Even without multiplexer 801, multiplexer 804 will route the $A_i$ signal to carry-out terminal $C_{i+1}$. A logic 1 in cell 805 can be used to cause multiplexer 923 to skip over the logic block.

Multiplexer 801 is useful in arithmetic operations to initiate a carry value, and in logic operations to initiate an AND function (by inputting a logic 1 in memory cell 802) or an OR function (by inputting a logic 0 in memory cell 802). It also provides a fixed value (0 in the case of an AND function, 1 in the case of an OR function) when multiplexer 923 is used to generate an AND function or an OR function of $C_i$ and $F_i$. Thus in other embodiments, either of multiplexers 801 and 804 is useful alone as well as in the combination shown in FIG. 8c.

Figure 8D:
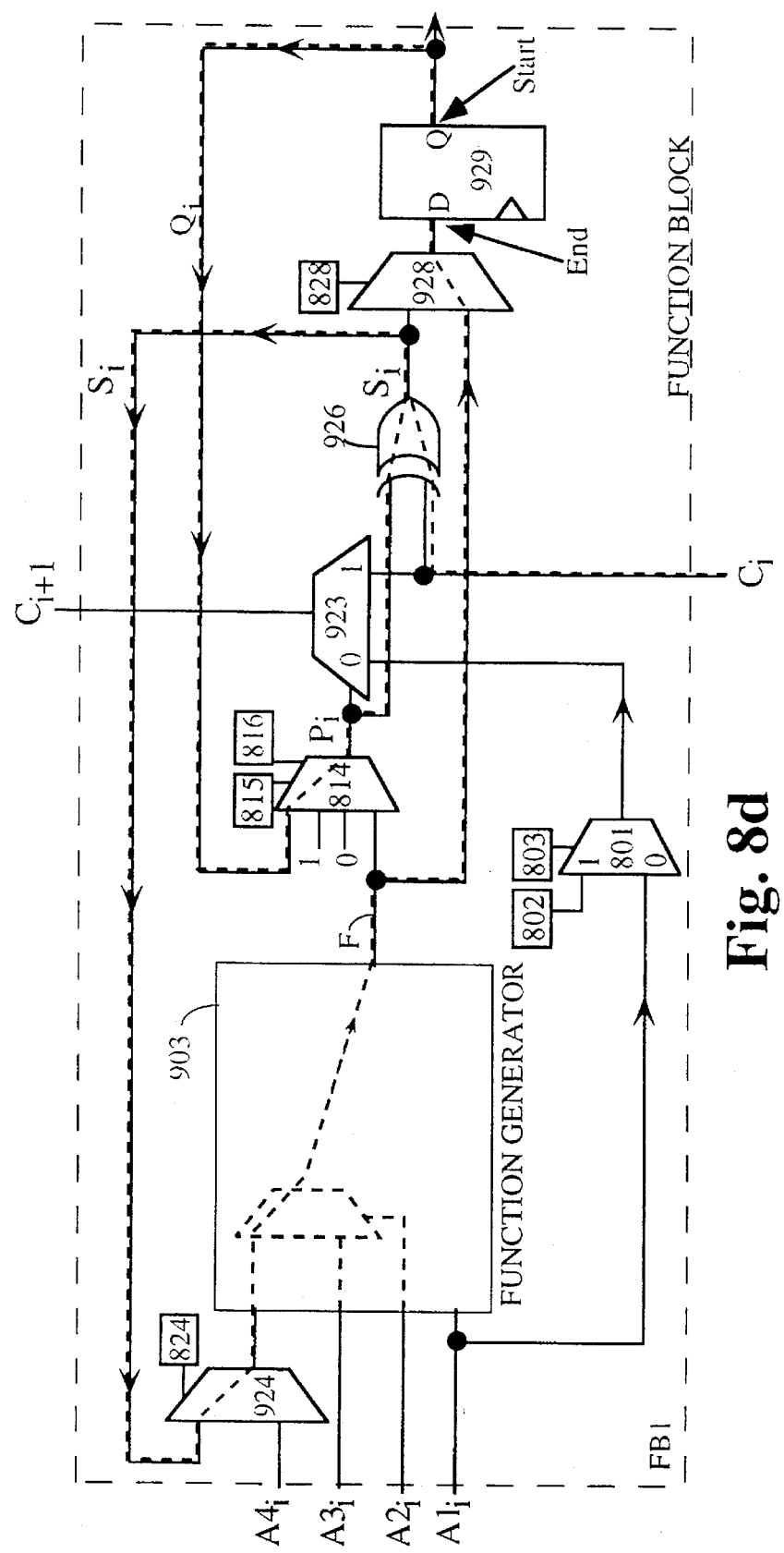
FIG. 8d shows a carry logic circuit especially useful for implementing loadable counters.

FIG. 8d shows a carry logic circuit especially useful for implementing loadable or non-loadable counters. Multiplexer 814 replaces multiplexer 804 of FIG. 8c. Two memory cells 815 and 816 control multiplexer 814 and thus the area occupied by multiplexer 814 and its related memory cells is approximately the same as that of multiplexer 804 of FIG. 8c and its two memory cells. Multiplexer 814 receives constant zero and one input signals and thus can perform the same functions and memory cell 805 which provides a constant to multiplexer 804. However, multiplexer 814 can select an additional fourth input signal. As a useful feature, this fourth input to multiplexer 813 is taken from the Q output of flip flop 929. Also provided is multiplexer 924, which is controlled by memory cell 824 to select between input signal $A4_i$ and the sum output $S_i$ of XOR gate 926.

When implementing a counter, function generator 903 is configured as a multiplexer, as indicated by dashed lines. Multiplexer 928 is controlled by memory cell 828 to provide the F output of function generator 903 to the D input of flip flop 929. And multiplexer 801 is controlled by memory cell 803 to provide a logical 0, which is stored in memory cell 802. A chain of such devices is configured in this manner, each representing a bit of the binary count, the Q outputs of flip flops 929 representing the binary value of the count. As D flip flops 929 respond to a switching clock signal (not shown), the D input values are transferred to the Q output terminals. Output signal $Q_i$ is applied by multiplexer 814 to carry multiplexer 923 and causes the carry-in signal $c_i$ to be forwarded to $C_{i+1}$ if $Q_i$ is logical 1 or to apply the logical 0 output from multiplexer 801 to $C_{i+1}$ if $Q_i$ is logical 0. The output of multiplexer 814 is combined with the $C_i$ signal by XOR gate 926 to generate the sum $S_i$. In bits not to be reloaded, function generator 903 forwards the sum $S_i$ to multiplexer 928 which applies the signal to the D input of flip flop 929. In counter bits which are to be reloaded (which may be all bits in some applications), an input signal $A2_i$ causes function generator 903 to provide as its F output signal the value on $A3_i$, which is loaded into D flip flop 929 on the next clock signal.

The counter implemented in the embodiment shown in FIG. 8d may require considerably less silicon area than a counter which must make use of external routing and which must use an extra function generator for loading. In addition, since the $Q_i$ and $S_i$ signals are fed back on direct connect lines having low capacitance, no programmable interconnect resistance, and no intervening buffers, a counter implemented in FIG. 8d as discussed above can be considerably faster than one using general interconnect lines for feedback.

Figure 8E:
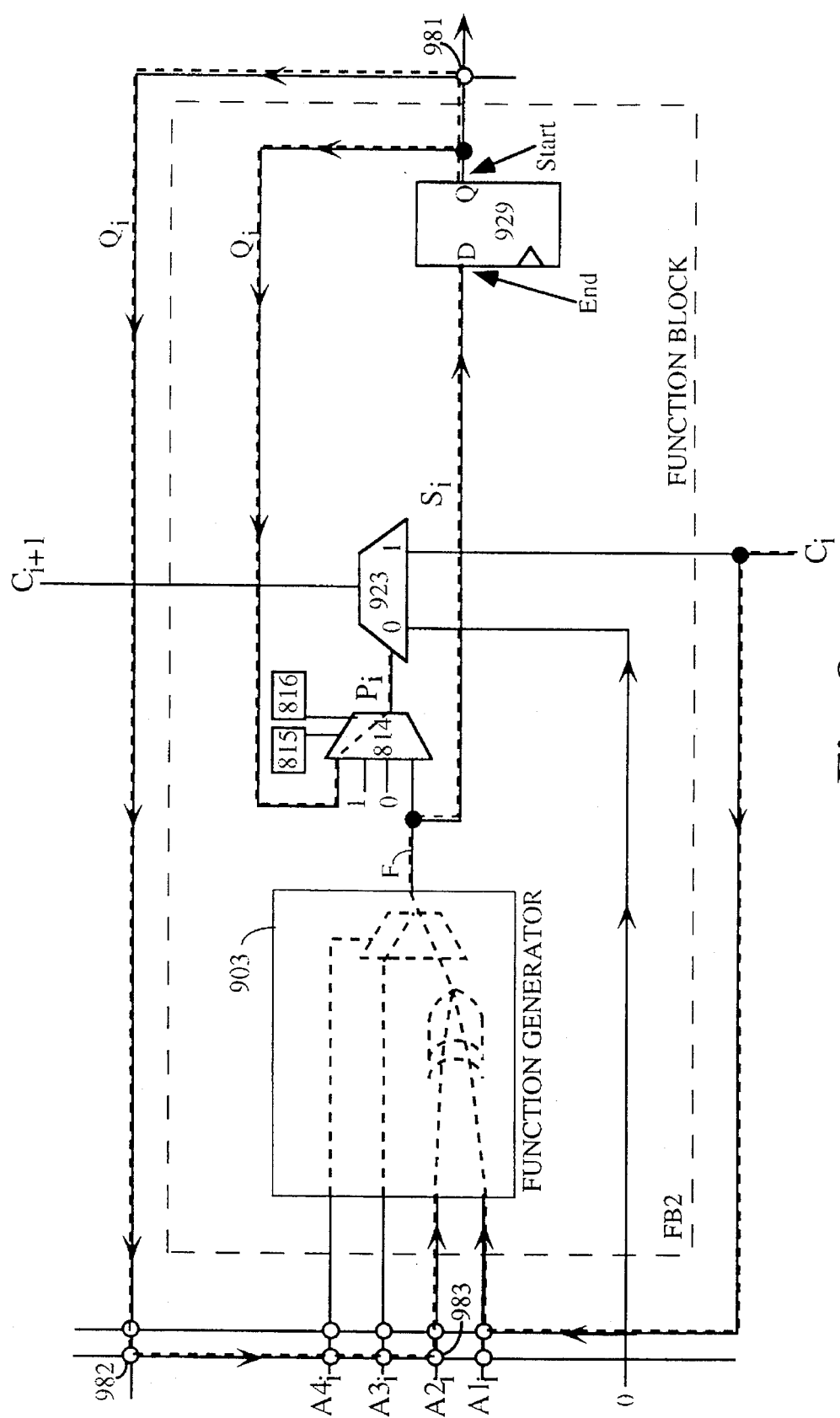
FIG. 8e shows a carry logic circuit useful for loadable counters and other functions and shows an application in which the circuit is configured to create a loadable up-counter.

FIG. 8e shows yet another carry logic circuit useful for implementing loadable counters, which is also useful for implementing other functions. In FIG. 8e, no XOR gate such as XOR gate 926 of FIG. 8d is provided. Instead, the XOR function is implemented in function generator 903. Also, multiplexer 801 of FIG. 8d is not provided. Instead, a separate line provides input to the 0 input terminal of carry multiplexer 923, and for a counter function a logical 0 is routed from the interconnect structure to this terminal. Further, since XOR gate 926 of FIG. 8d is not provided, multiplexer 928 of FIG. 8d is also not provided.

As can be seen in FIG. 8e, function generator 903 implements both the XOR function and the multiplexer for loading the counter. Thus the loadable counter as implemented in FIG. 8e uses all four input ports of function generator 903.

The Q output signal of flip flop 929 is provided on a fast path through multiplexer 814 to the control terminal of carry multiplexer 923 and also through general interconnect including three programmable connectors 981, 982, and 983 to the A2$_i$ input of function generator 903. This is not a fast path, but since the delay of this path is not cumulative from one bit to the next, and must simply arrive at the D input of flip flop 929 before the next clock edge, the delay through connectors 981, 982, and 983 and function generator 903 does not significantly affect the counter speed. The counter speed is limited mainly by the repeated carry chain. In FIG. 8e, since the Q output signal from flip flop 929 is provided through general interconnect lines and programmable connectors to function generator 903, no multiplexer such as multiplexer 924 of FIG. 8d is provided so that FIG. 8e requires less area than FIG. 8d.

Other functions which are efficiently implemented by the circuit of FIG. 8e are a non-loadable counter, a down counter (by supplying 1 instead of 0 to the 0 input of multiplexer 923 and implementing the XNOR function instead of XOR in function generator 903), and a non-loadable up-down counter.

Figure 8F:
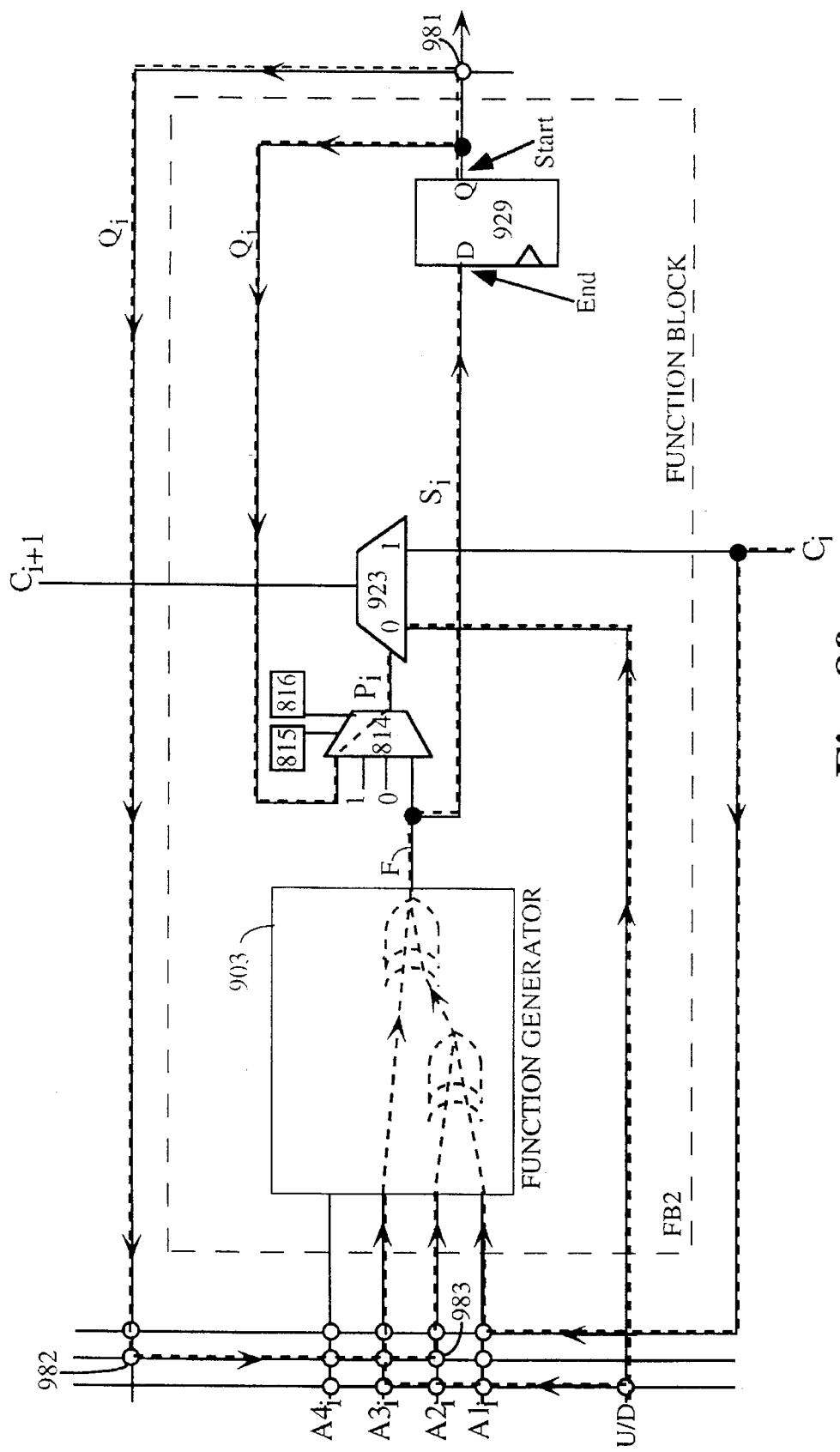
FIG. 8f illustrates the same carry logic circuit of FIG. 8e configured to create a non-loadable up-down counter.

FIG. 8f shows the implementation of a non-loadable up-down counter in the circuit of FIG. 8e. In FIG. 8f, a three-input XOR function is implemented in function generator 903. The up/down control signal U/D is applied to the 0 input of multiplexer 923 and also to the third input (A3$_i$) of function generator 903.

Carry Logic Circuits According to the Present Invention

Figure 9A:
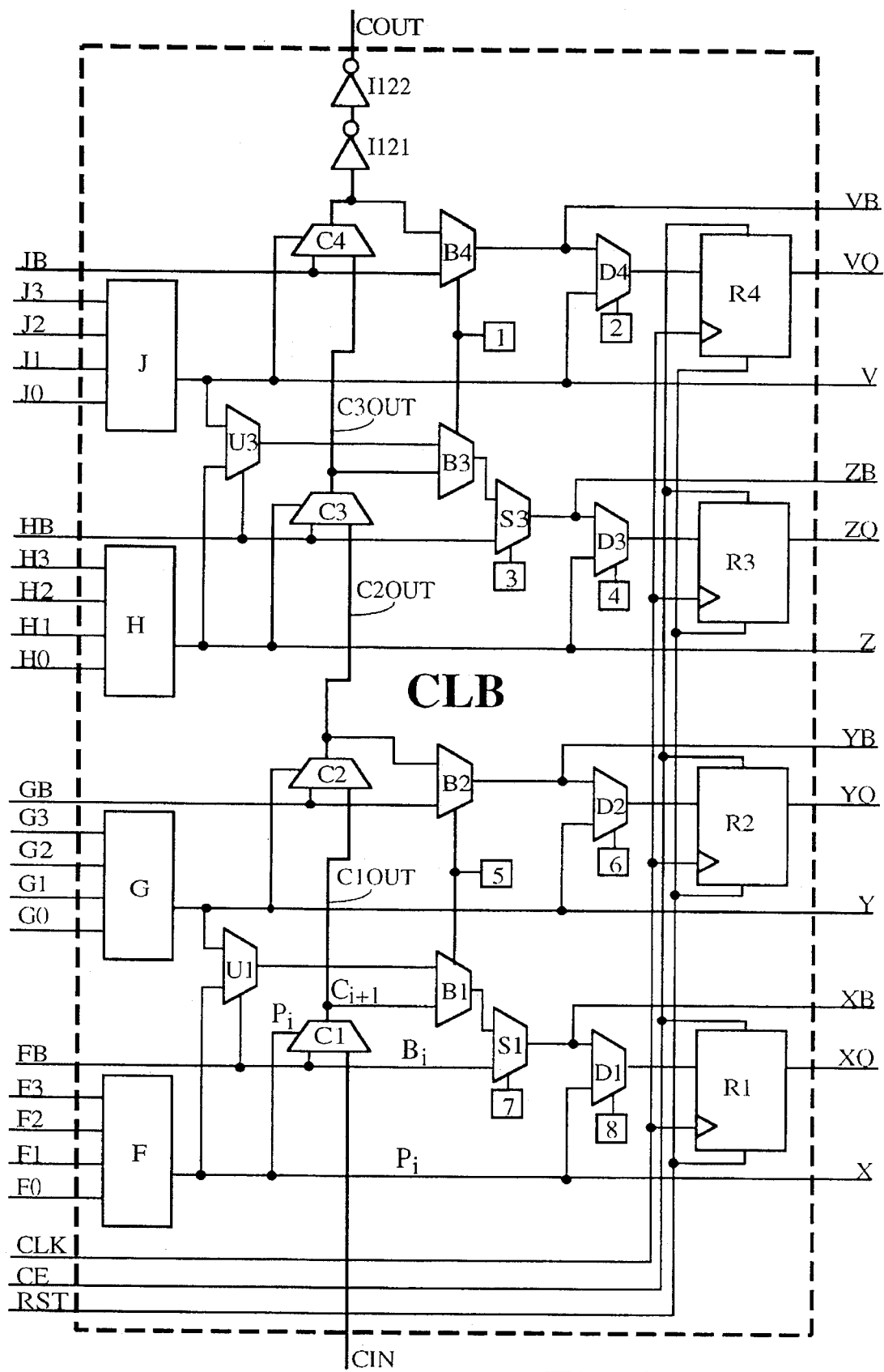
FIG. 9a shows a schematic diagram of a configurable logic block (CLB) in accordance with the invention, having four stages, which implements the circuit of FIG. 8b when combined with another CLB for computing the sum.

FIG. 9a illustrates a configurable logic block CLB which implements the embodiment of FIG. 8b. Four function generators F, G, H, and J are included in logic block CLB. Function generators F, G, H, and J each comprise look-up tables as discussed above in connection with FIGS. 9a through 9d. Thus, each function generator provides any function of the input signals F0 through F3, G0 through G3, H0 through H3, and J0 through J3 respectively. To implement an arithmetic function of input variables A and B, one bit is handled in each of the function generators. For example, the lowest-order sum bit $S_0$ may be calculated from the lowest-order bits of A and B, namely bits $A_0$ and $B_0$, in the F function generator. Bit $A_0$ is provided to both the FB input terminal and to an input terminal F0, F1, F2, or F3 of the F function generator. Bit $B_0$ is provided to another terminal of the F function generator or generated within the function generator as a function of the other inputs. For performing addition, a logical 0 is provided on carry-in line CIN. Likewise, bits $A_1$ and $B_1$ are provided to the G function generator, and so forth for the higher-order bits. The function generators are each programmed by loading the appropriate lookup table to generate the XOR function of the A and B bits as indicated by unit 903 of FIG. 8b. (As shown in FIG. 8b, the B input value may be generated internally to the function generator as a function of other inputs on lines not used for the A input. This is possible because the function generator may provide any function of four inputs.) Thus the function generators implement any data modification 921 and each generate XOR function 922 of the corresponding bits $A_i$ and $B_i$. This embodiment does not limit arithmetic operations to four-bit numbers because the CLB is formed as part of an array of CLBs, and higher-order bits may be handled in CLBs connected above the CLB shown.

Figure 1A:
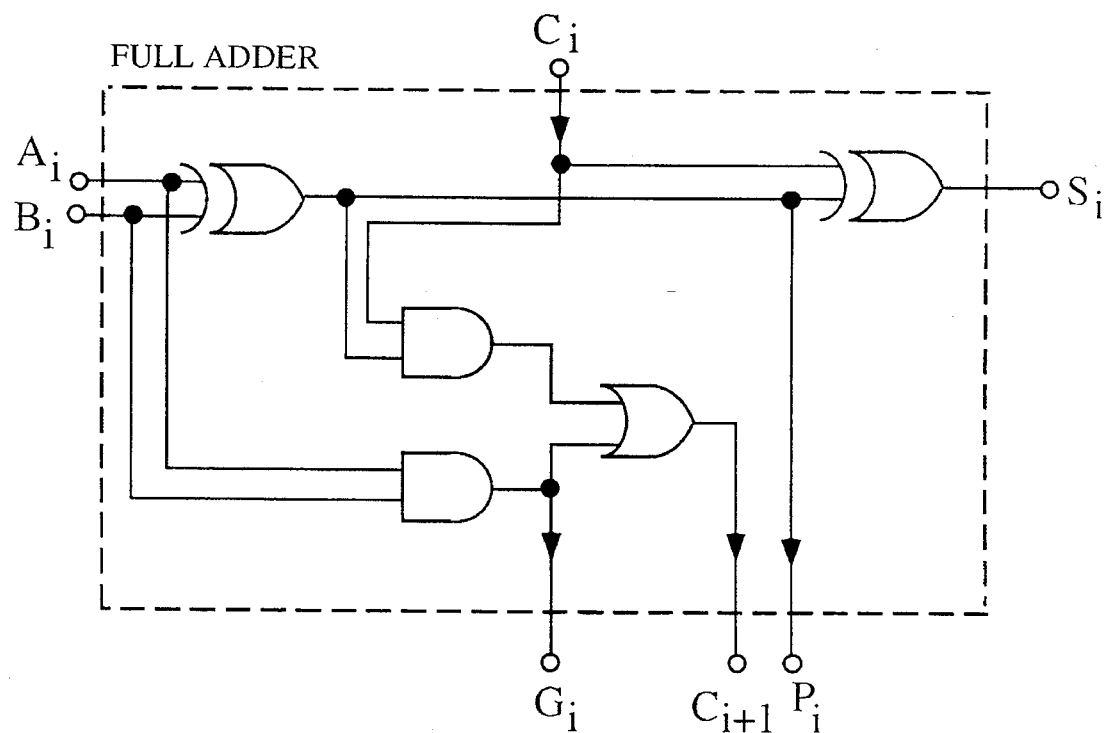
FIG. 1a is a schematic diagram showing one stage of a conventional full-adder.
Figure 1B:
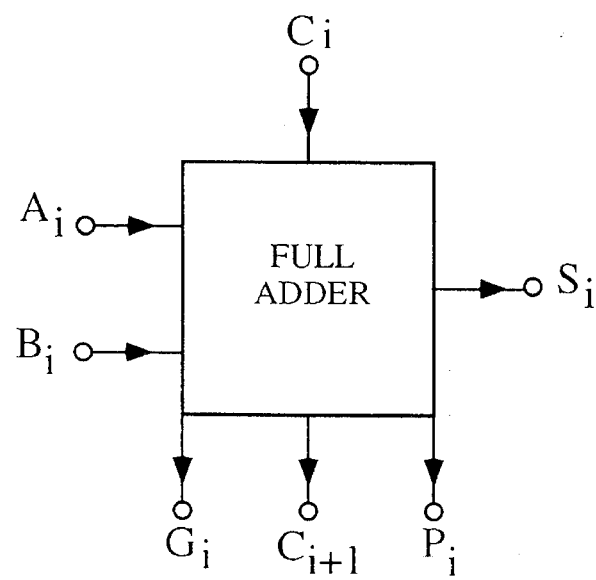
Figure 2:
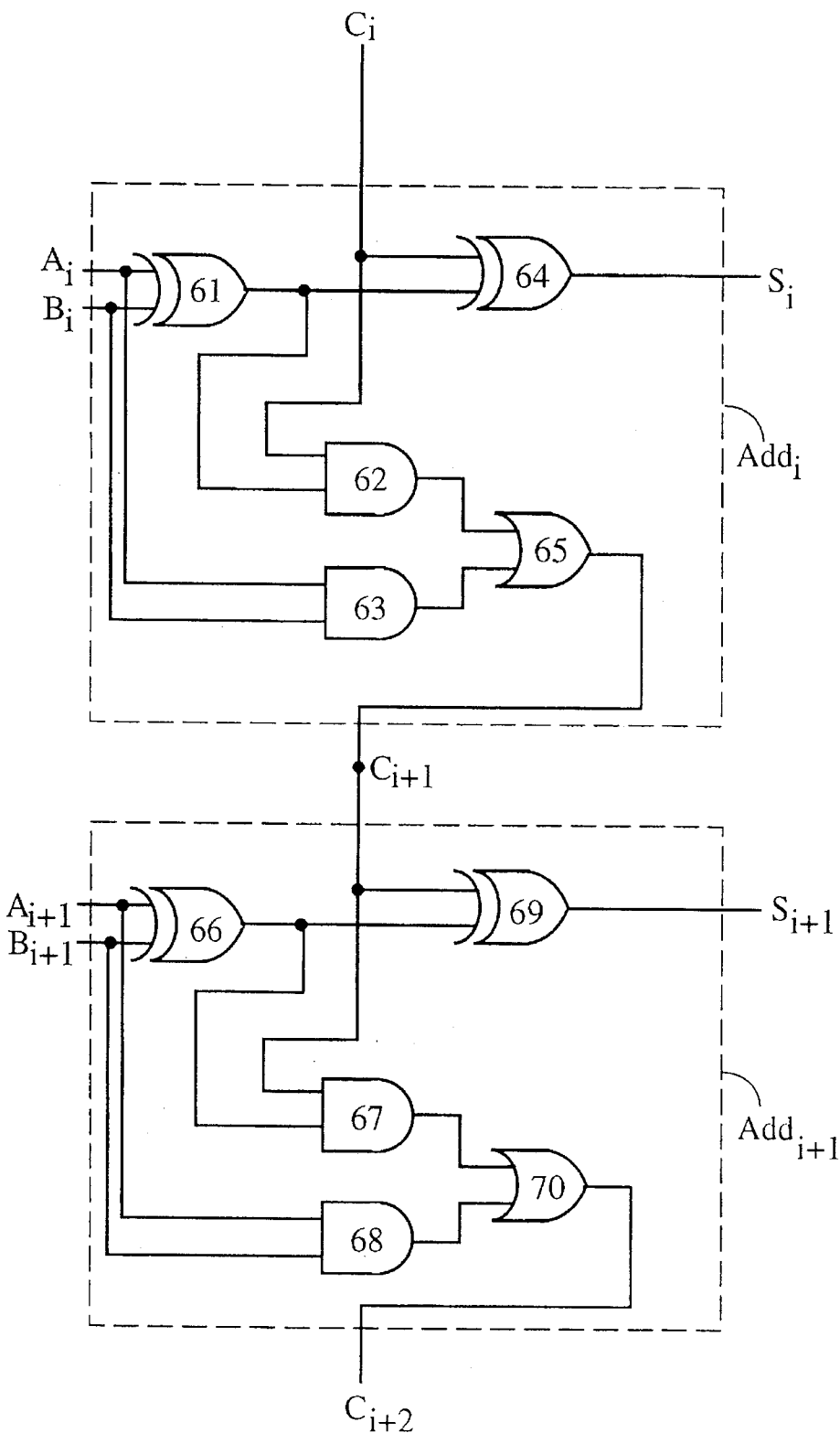
FIG. 2 is a schematic diagram of two full adders cascaded together.
Figure 3:
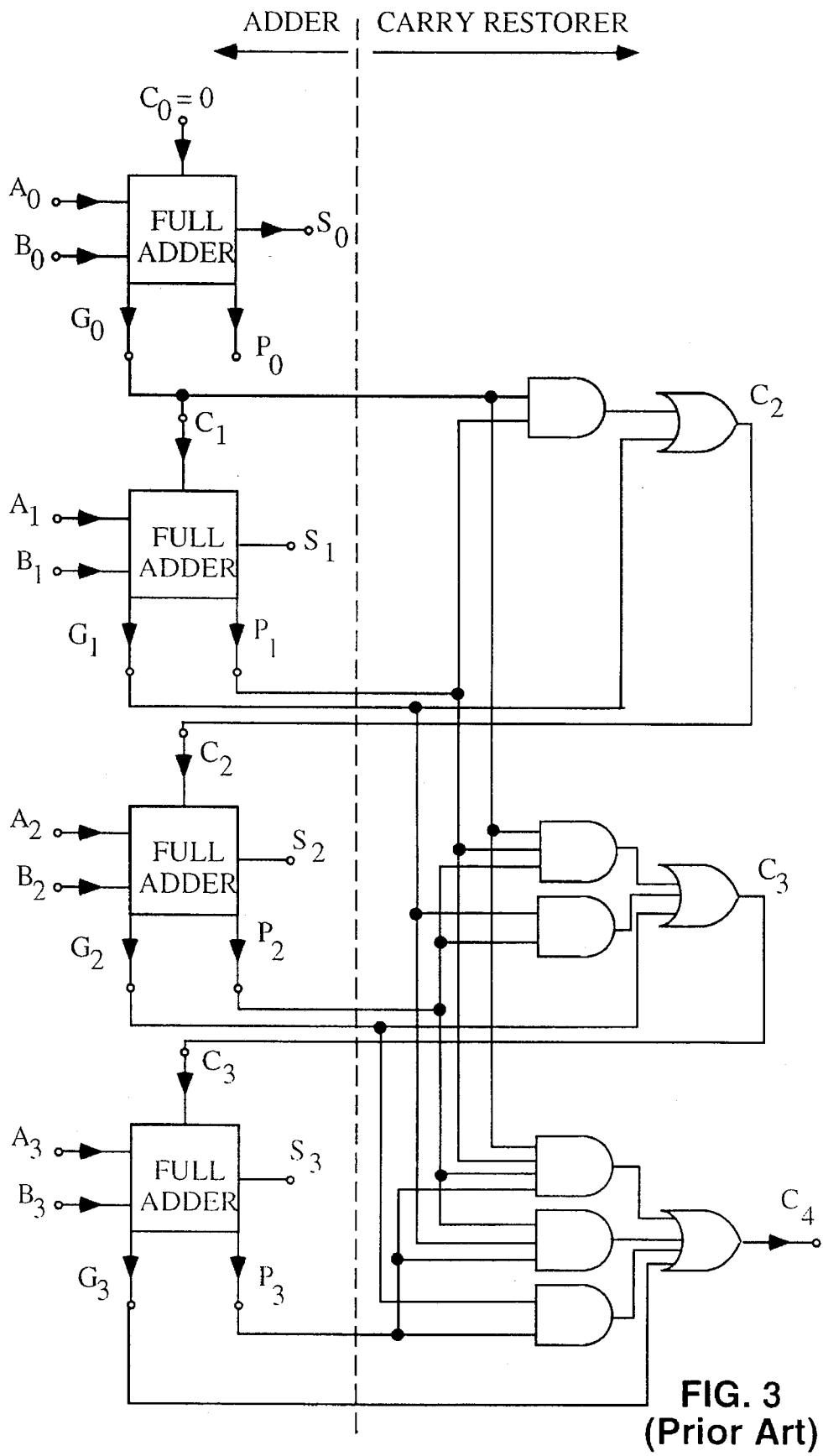
FIG. 3 is a schematic diagram of a four-bit adder with look-ahead carry logic.
Figure 4A:
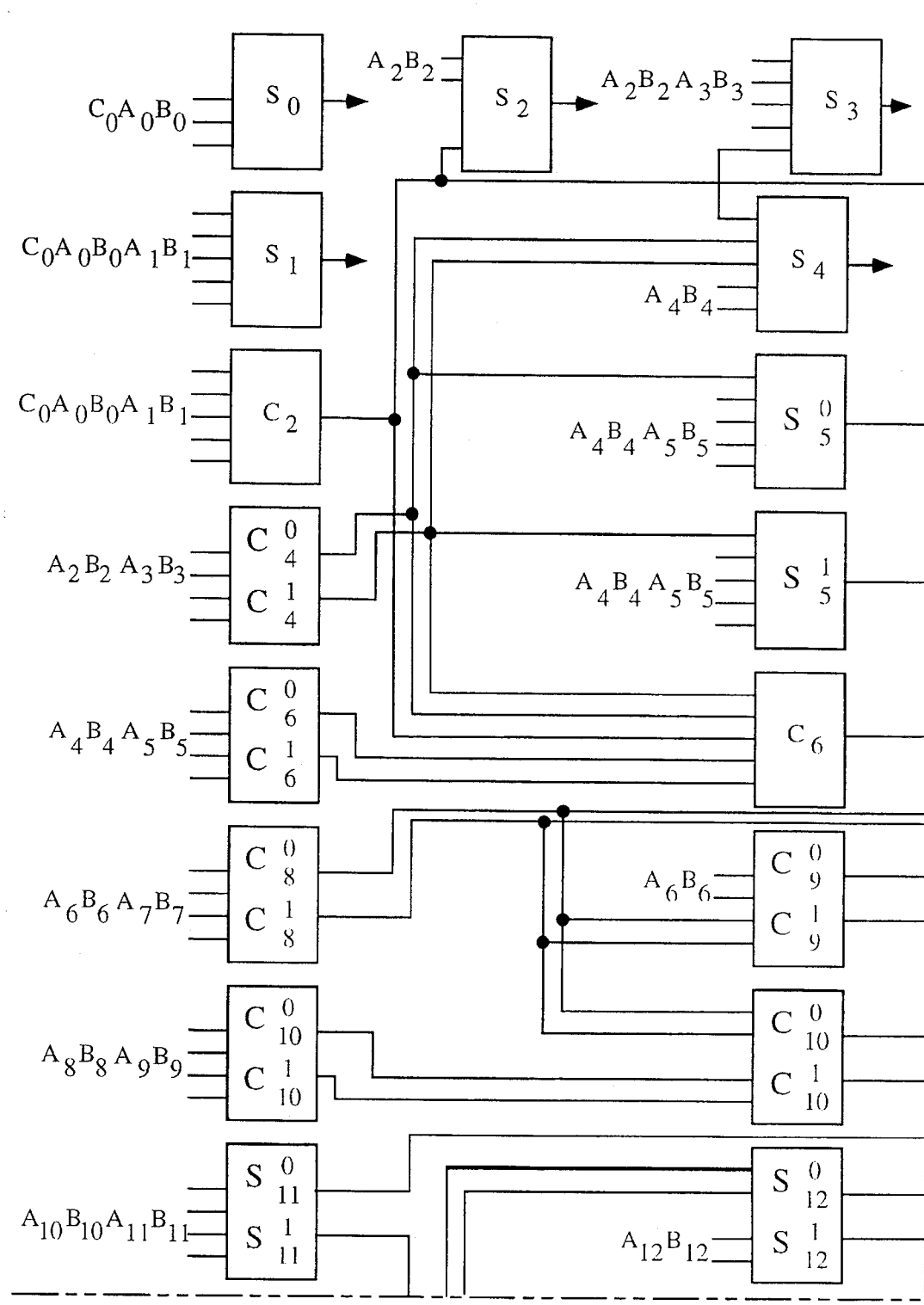
FIG. 4 is a schematic diagram of a prior art adder, which comprises FIGS. 4a through 4d.
Figure 4B:
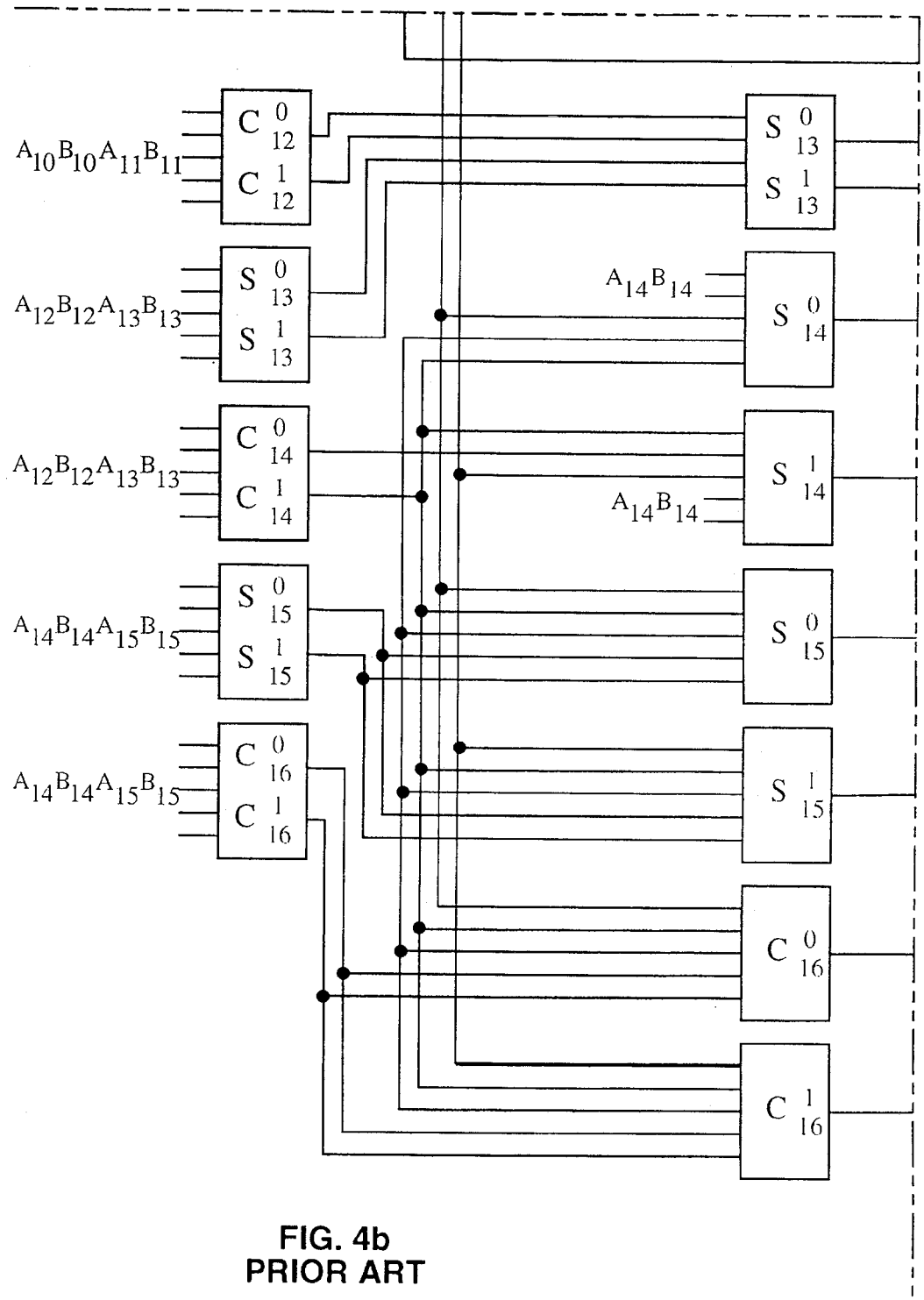
Figure 4C:
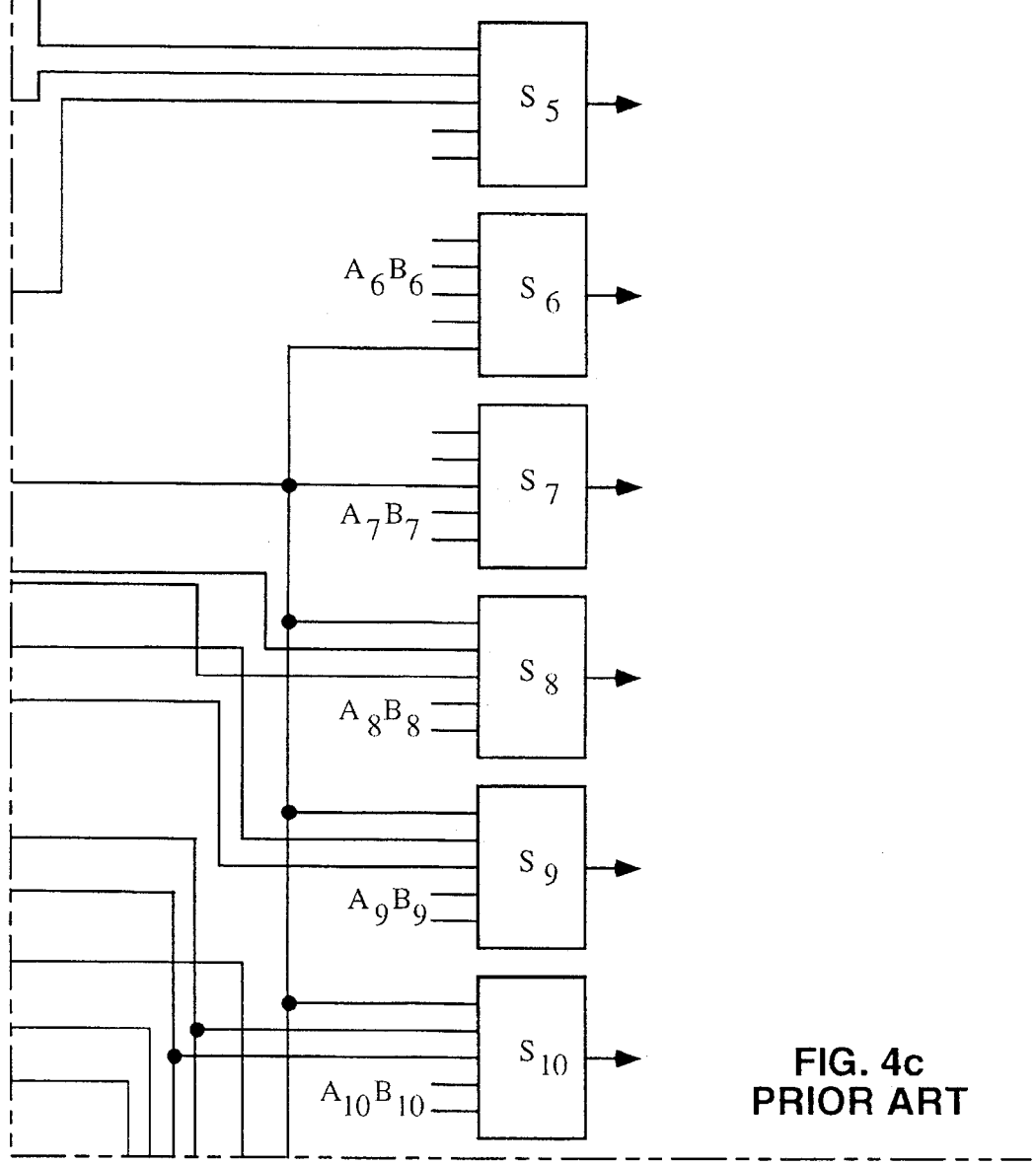
Figure 4D:
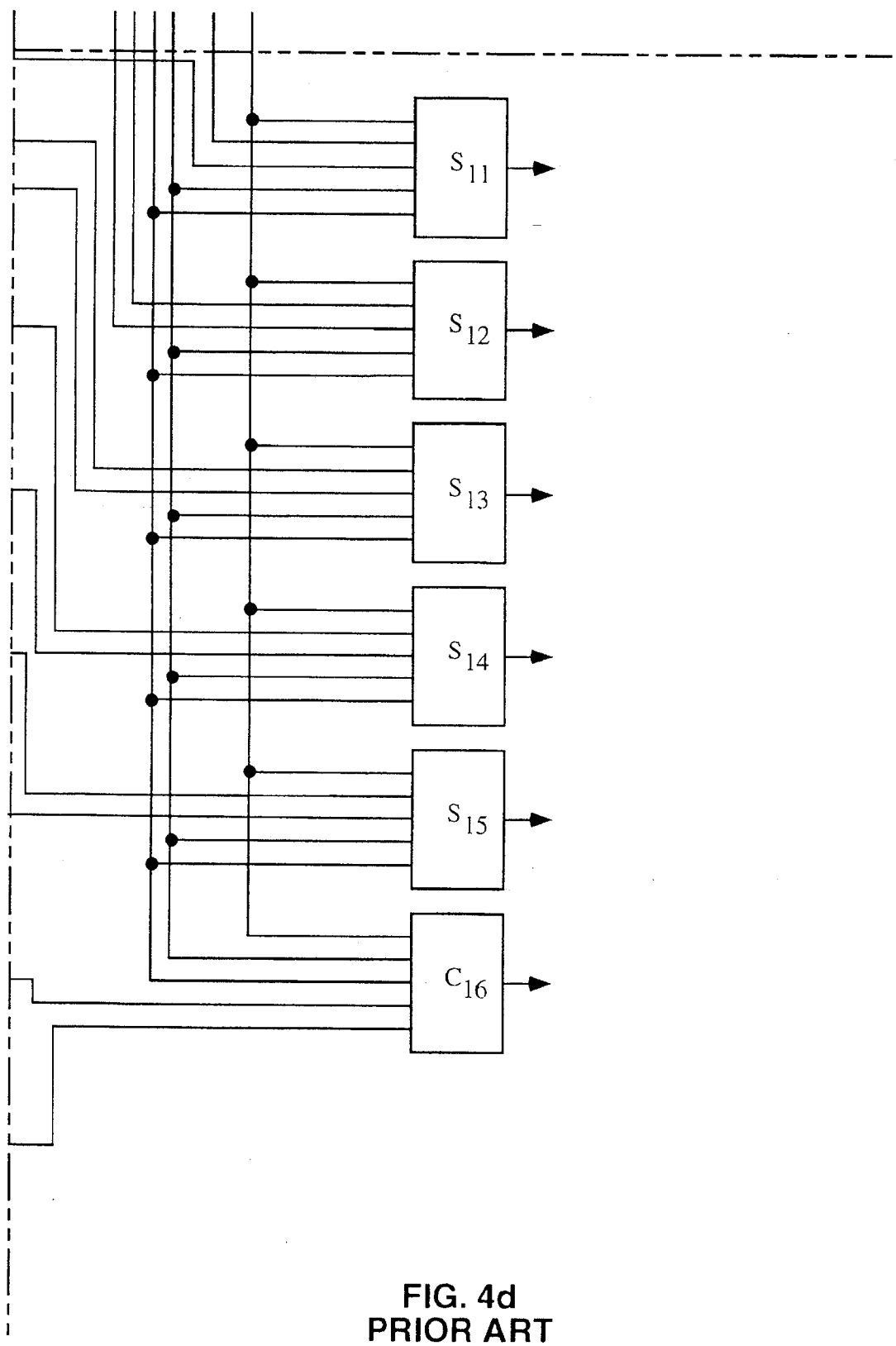
Figure 5:
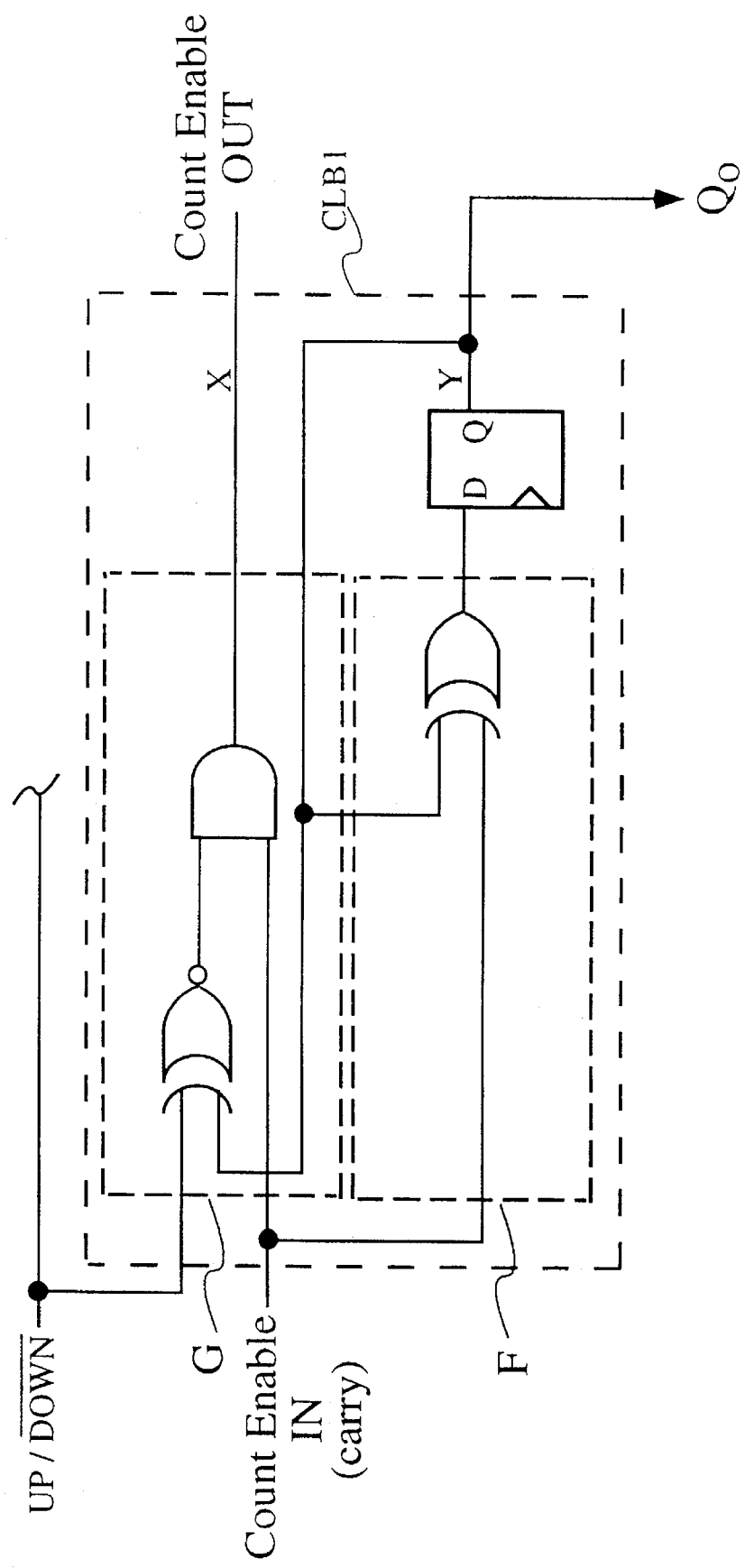
FIG. 5 is a schematic diagram of a prior art counter.
Figures 6A, 6B, 6C:
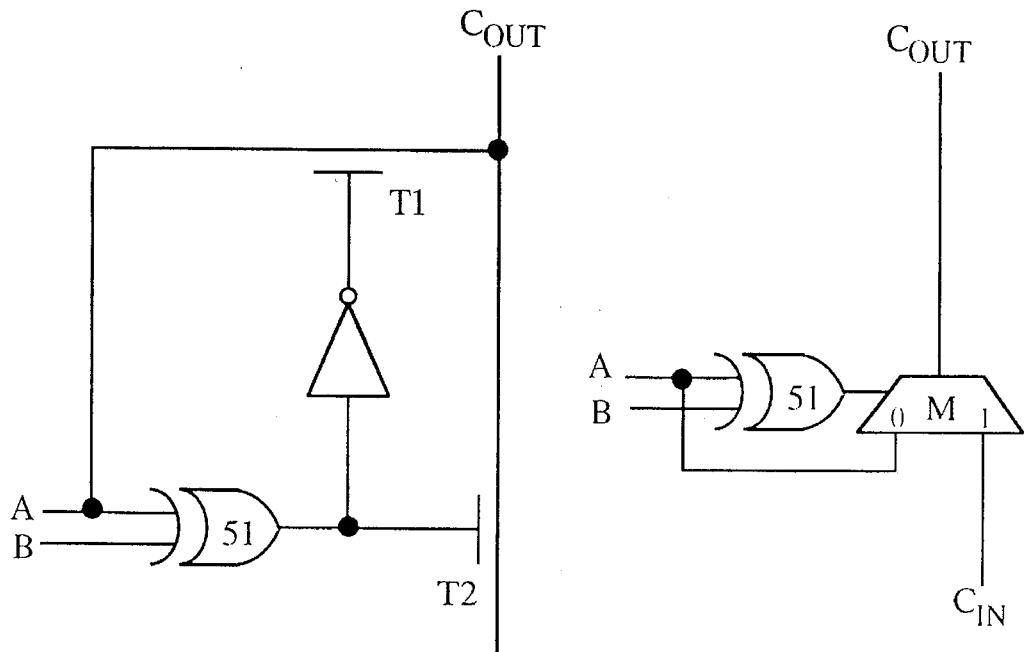
Figure 7A:
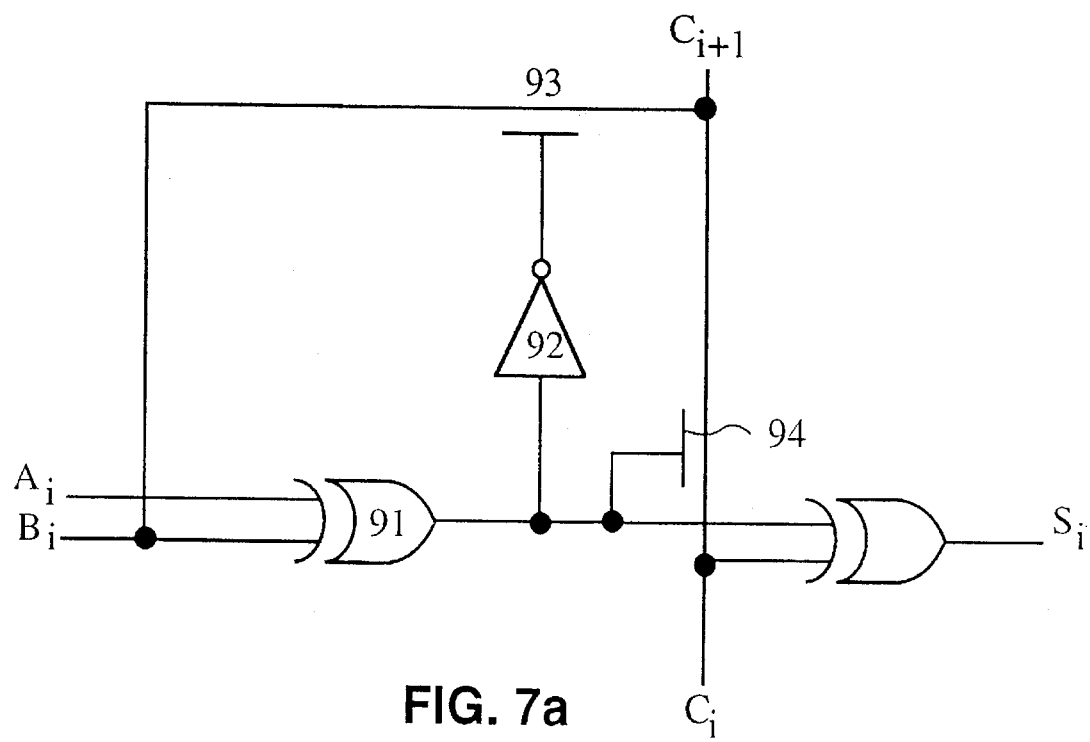
FIG. 7a is a schematic diagram of a circuit providing one bit of a full adder that uses the carry logic provided by the present invention.
Figure 7B:
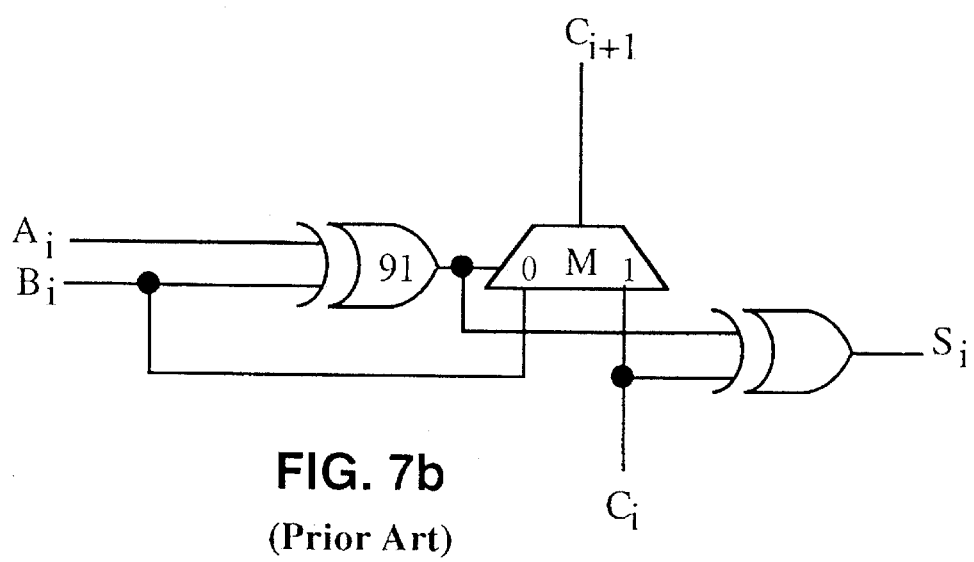

Associated with the function generators are fast carry MUXes C1, C2, C3, and C4. MUX C1 receives a carry-in signal CIN (which will be 0 if the arithmetic is addition and the F function generator is receiving the lowest-order bits) and a B input signal FB, and generates an output signal C1OUT. MUX $C_2$ receives the C1OUT signal and a second B input signal GB, and generates an output signal C2OUT. MUXes C3 and C4 are connected equivalently. MUX C4 generates the COUT signal from the logic block CLB. Function generators F, G, H, and J provide as output signals X, Y, Z, and V respectively, the respective carry-propagate signal $P_i$. These output signals control carry MUXes C1, C2, C3, and C4 as discussed in connection with FIG. 6a, and thus provide a cumulative carryout function COUT.

It is necessary to provide periodic repowering of the carry signal, as was discussed in connection with inverters I101 and I102 of FIG. 10. The frequency with which repowering buffers are provided depends upon the interconnect architecture in which the invention will be used. As shown in FIG. 9a, a repowering buffer comprising inverters I121 and I122 is positioned every four multiplexers in the carry path, or once every CLB. In another embodiment, repowering buffers are provided every two multiplexers in the carry path, thus two repowering buffers are provided in every CLB. Of course, the invention is not limited to an architecture in which one CLB comprises four function generators. Many other variations are also possible.

The embodiment of FIG. 9a uses another CLB identical to the one shown but positioned adjacent, preferably to the right or left of that shown, to generate the sum $S_i$ of FIG. 8b. To provide the carry-propagate signal $P_i$ to the sum CLB to its left or right, MUXes B1, B2, B3, and B4 are set by their respective memory cells 1 and 5 to forward the outputs of carry MUXes C1, C2, C3, and C4. Memory cells 3 and 7 are likewise set to cause MUXes S3 and S1 to forward the outputs of MUXes B3 and B1. Thus the outputs of carry MUXes C1, C2, C3, and C4 appear at output lines XB, YB, ZB, and VB. As one example, in the sum CLB to the right or left of the carry CLB, output X and the CIN signal are connected to two of the four inputs F0 through F3 of the sum CLB, which is configured to calculate the XOR function of these two inputs. Similarly, outputs Y and XB (which is the carry-in of the next stage) are connected to two inputs G0 through G3 of the G function generator, which is also configured to calculate XOR of these two inputs. Equivalent connections and configurations are performed for the H and J function generators. In the sum CLB, function generators F, G, H, and J then provide the sum outputs for successive bits.

Figure 9B:
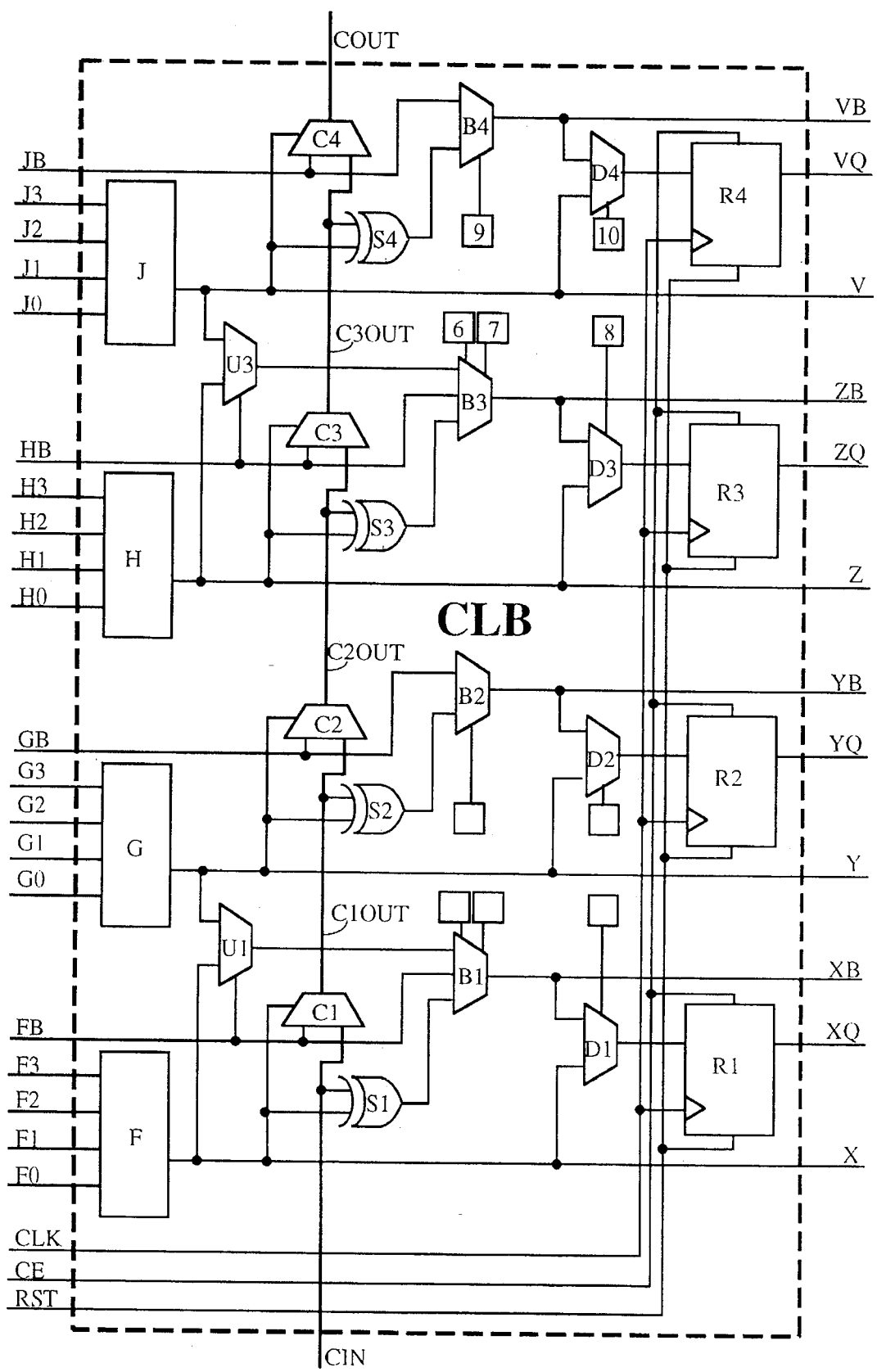
FIG. 9b shows another CLB in accordance with the invention, which implements the circuit of FIG. 8b by using dedicated hardware for computing the sum.

FIG. 9b shows another embodiment of the invention which requires only a single function generator per bit. The CLB of FIG. 9b is similar to that of FIG. 9a, but includes XOR gates S1 through S4 for calculating the sum.

In the embodiment of FIG. 9a, a single memory cell 1 controls both of MUXes B3 and B4, while in the embodiment of FIG. 9b, MUX B4 is controlled by memory cell 9 and MUX B3 is a three-input MUX controlled by memory cells 6 and 7. And, as discussed, in the embodiment of FIG. 9a the carry and sum of one bit are calculated in two different CLBs while in the embodiment of FIG. 9b, XOR gates S1 through S4 allow both the carry and sum to be calculated in a single CLB. Thus the embodiment of FIG. 9b is more efficient for implementing arithmetic functions and the embodiment of FIG. 9a has higher density and therefore lower cost per CLB. Many other variations are of course possible. For example, in FIG. 9b, memory cell 9 may control MUX B3 and also replace one of memory cells 6 and 7 to provide one control to MUX B4, thus saving a memory cell. In another embodiment, one memory cell may activate the carry mode in all four memory cells B1 through B4.

Note that the function generator inputs, for example F0 through F3 are fully swappable. An input signal may be directed to any selected one of these inputs. This interchangeability may be an advantage when routing the signals through the interconnect structure, to be discussed below. Note also, that in FIGS. 9a and 9b, any data modifying logic (see data modification unit 921 in FIG. 8b) is completely user-selectable, and is not restricted by having to place arithmetic inputs onto particular pins. Thus, the software which routes the user's design finds a route more easily, and the route typically requires a shorter path. Further, in comparing the invention as illustrated in FIG. 8b to the device of FIG. 8a, the device of FIG. 8a requires that the $A_i$, $B_i$, and $C_i$ inputs be provided to the function generator 902, thus limiting the number of additional inputs to one. By contrast, the embodiment of FIG. 8b can accommodate in data modification function 921 any function of three variables. If the sum $S_i$ is calculated in another function generator 904, that function generator may modify the $S_i$ function in data modification area 927 by any function of two additional inputs.

Routing Architecture in Which The Carry Circuit May Be Used

Figure 9C:
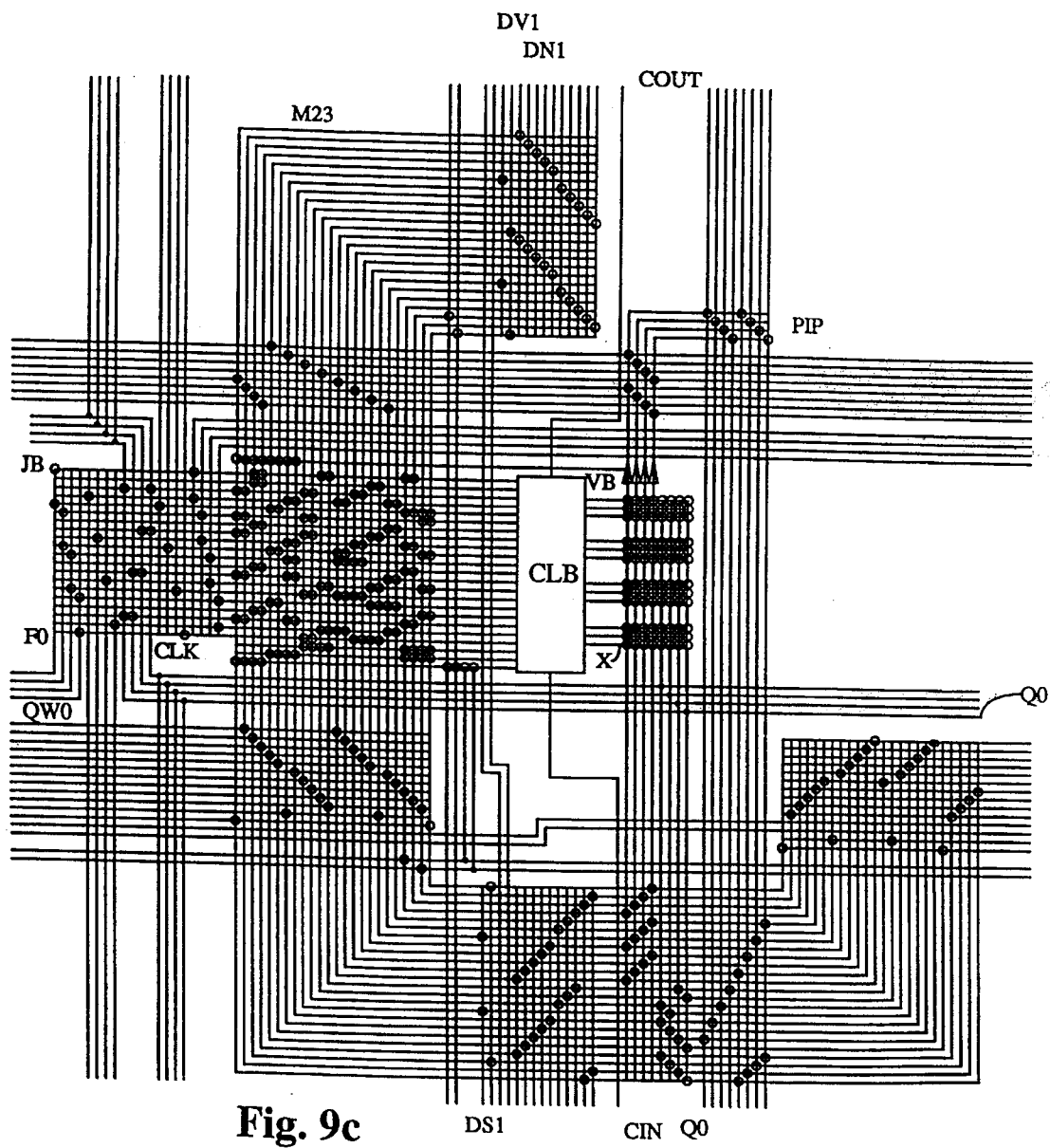
FIG. 9c shows a tile which combines the CLB of FIG. 9a or 9b with interconnect routing for interconnecting an array of CLBs.
Figure 9D:
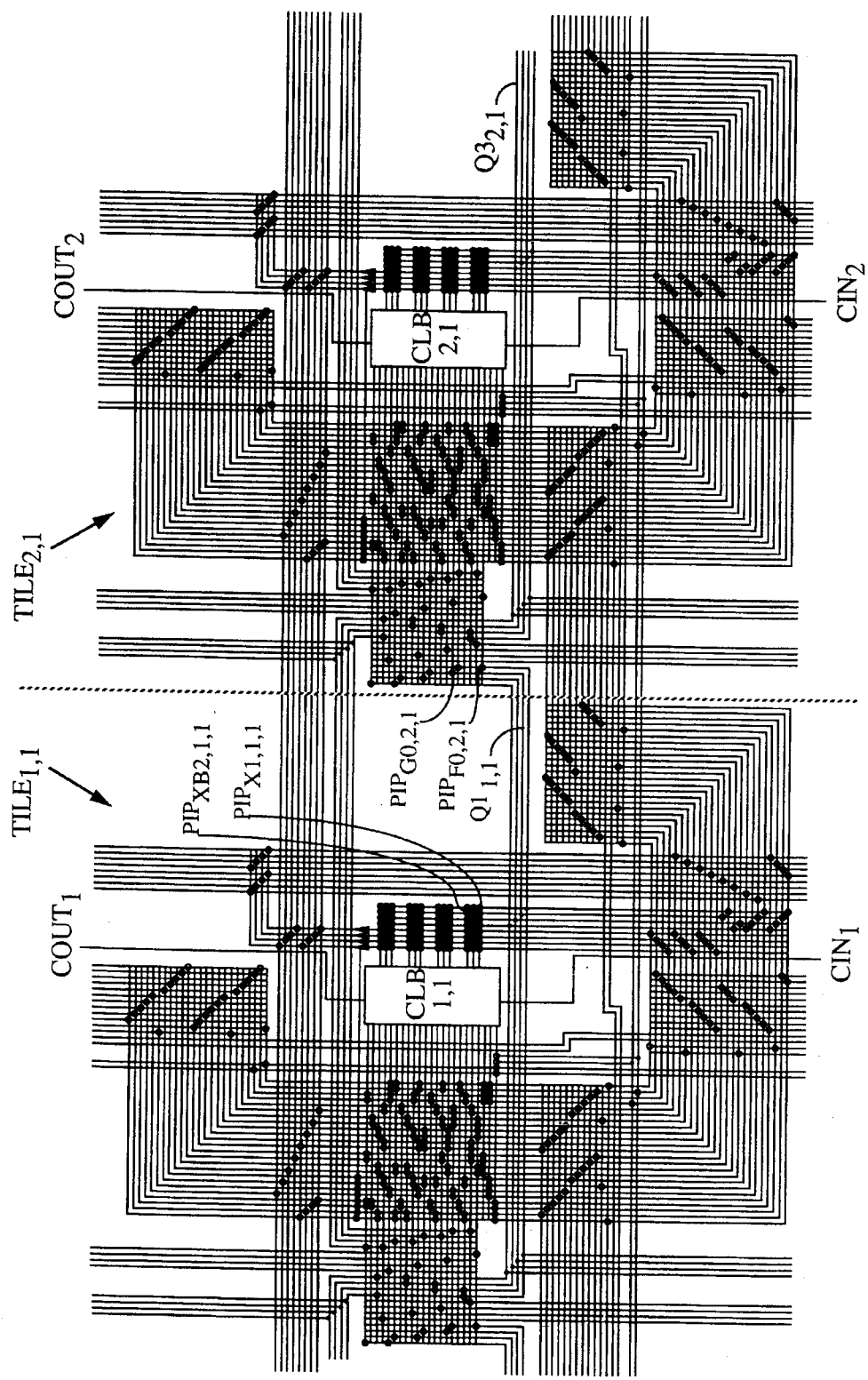
FIG. 9d shows two of the tiles of FIG. 9c connected together horizontally.

An architecture for routing signals from one CLB to another is illustrated in FIGS. 12c and 12d. FIG. 9c shows a tile which combines logic and routing. FIG. 9d shows two horizontally adjacent tiles, $TILE_{1,1}$ and $TILE_{2,1}$ connected together as they are when forming a chip such as shown in FIG. 9e. Lines extending to the right in $TILE_{1,1}$ are shown to line up with and connect to lines extending to the left in $TILE_{2,1}$. The core tile of FIG. 9c also includes lines at the top and bottom of the tile. When placed one above the other, these top and bottom lines also connect. In a complete integrated circuit chip, the tiles of FIG. 9c are combined to form a structure such as shown in FIG. 9e, where elements C comprise core tiles, elements N, S, E, and W comprise north, south, east, and west edge tiles for input and output to the chip, and elements NW, NE, SW, and SE comprise corner tiles for additional chip input and output. Dividers such as DS and DC allow adjoining conductive lines to be programmably connected or not connected.

With respect to FIG. 9c, the CLB of FIG. 9a or 9b is shown near the center of the figure. Input lines JB through CLK positioned at the left of FIGS. 9a and 9b are also positioned correspondingly at the left of the CLB of FIG. 9c. For simplicity, only lines JF, F0, and CLK are labeled. As in FIG. 9a or 9b, carry-in input line CIN extends from the bottom of the drawing into the CLB, and carry-out line COUT extends out from the top of the drawing. Output lines VB through X extend from the right of the CLB in FIGS. 9a and 9b, and also in FIG. 9c. In FIG. 9c, only lines VB and X are labeled. Also shown in FIG. 9c are 24 input select lines M0 through M23, of which only M23 is labeled for simplicity. Lines M0 through M23 select input signals from tiles to the north, south, east, and west for input to the CLB. Many small open circles are shown in FIG. 9c. Each represents a programmable interconnect point or PIP, which, by means of a transistor, several transistors, an antifuse, an EPROM cell, or other means can be programmed to electrically connect the horizontal line and vertical line crossing within the circle. For simplicity, only one PIP has been labeled. Also shown in FIG. 9c are hard connections, each represented by a black dot. CLB output lines VB through X can be programmably connected by a PIP to one of the lines, for example Q0 having hard connections.

Looking at FIG. 9d, the propagate signal $P_i$ on the X output of the F function generator of $CLB_{1,1}$ in tile $TILE_{1,1}$ can be connected by $PIP_{X1,1,1}$ to direct interconnect line $Q0_{1,1}$, which extends into tile $TILE_{2,1}$ and can be connected by $PIP_{FO4,2,1}$ to the F0 input of $CLB_{2,1}$. As shown in FIG. 9a, the carry-out signal $C_{i+1}$ from fast carry MUX C1 is connected through multiplexers B1 and S1 to the XB output of $CLB_{1,1}$. $PIP_{XB2,1,1}$ connects to another direct connect line $Q1_{1,1}$ which connects through $PIP_{GB3,2,1}$ to input line G0 of the G function generator of $CLB_{2,1}$. This serves as the carry-in input $C_i$ for the next sum bit to be calculated in the G function generator of $TILE_{2,1}$. Higher-order bits are connected correspondingly. Thus the propagate and fast-carry functions occur in $TILE_{1,1}$ and the sum function occurs in $TILE_{2,1}$.

The full interchangeability of pins F0 through F3 may have one of two beneficial effects. In the embodiment of FIG. 9d, a low number of PIPs can provide sufficient interconnectability. Since each PIP requires about six transistors, reducing the number of PIPs reduces the size of the chip. Alternatively, if more PIPs are provided, a fast route for all function generator inputs is generally available, and therefore the chip operation is faster.

Additional Functionality

When not being used for the carry function in an arithmetic operation, the carry multiplexers C1 through C4 of FIG. 9a or 9b can be used for generating the AND and OR function as well as certain other functions. For example, by placing a logical 0 on line FB of FIG. 9a, multiplexer C1 is programmed to generate the AND function of the X output signal of the F function generator and the carry-in signal CIN. By placing a logical 1 on line FB, multiplexer C1 is programmed to generate the OR function of the complement of the X output signal and the carry-in signal CIN.

Circuit Which Provides Both Carry Logic and Other Logic

Figure 10:
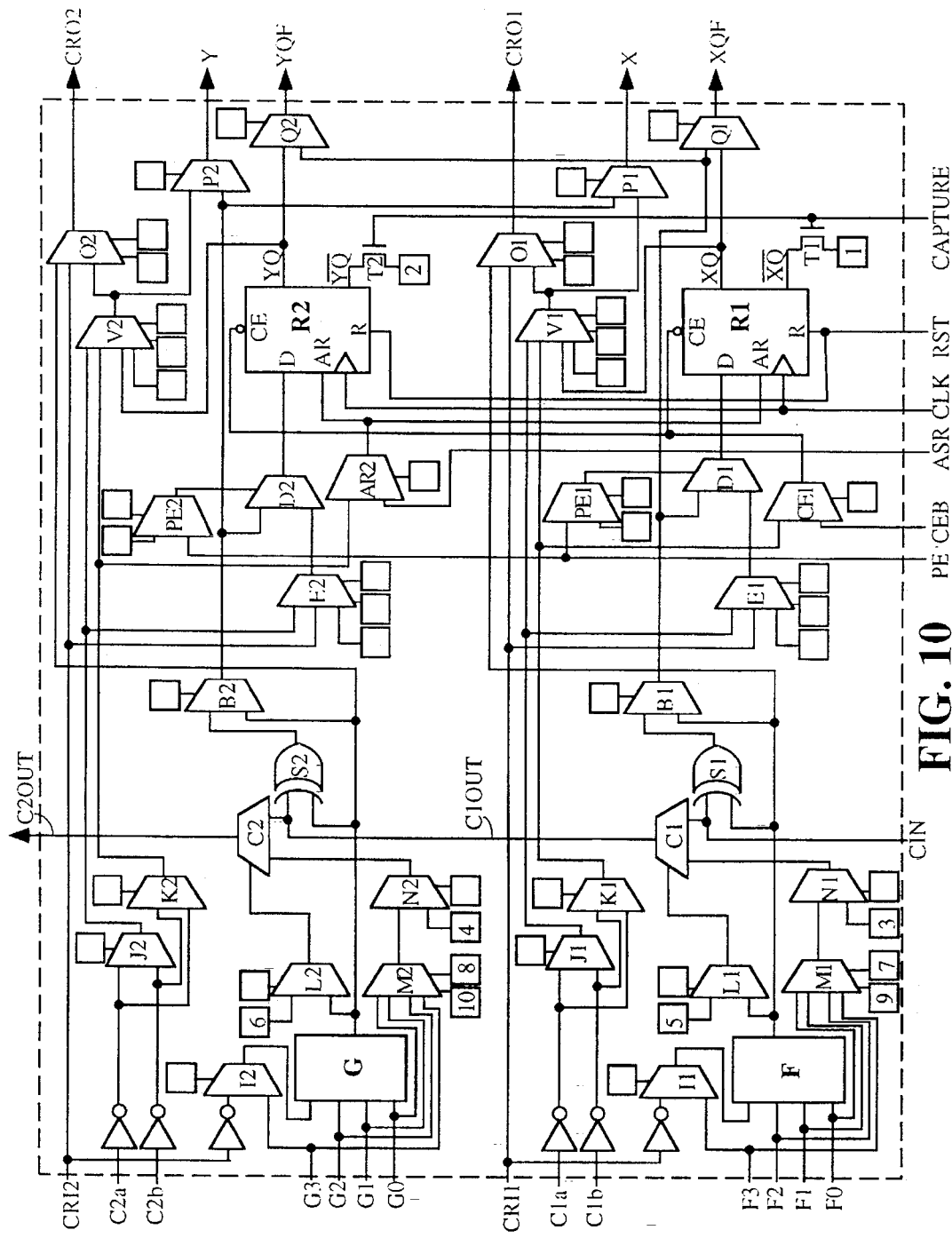
FIG. 10 shows a CLB in accordance with the invention which implements the circuit of FIG. 8c.

FIG. 10 illustrates a configurable logic block CLB which implements the embodiment of FIG. 8c. Two function generators F and G are included in the logic block of FIG. 10. Function generators F, G each comprise look-up tables. Thus, each function generator provides any function of the input signals F0 through F3, or G0 through G3. As in FIG. 9a or 9b, to implement an arithmetic function, one bit is handled in each of the function generators. Multiplexers N1 and N2 are set to forward the values from M1 and M2 to input terminals of carry multiplexers C1 and C2. Similarly, multiplexers L1 and L2 are set to forward the outputs of function generators F and G to the control terminals of carry multiplexers C1 and C2. In this mode, the components of FIG. 10 behave as corresponding components in FIGS. 9a and 9b.

However, multiplexers L1, L2, M1, M2, N1, and N2 offer additional functionality in use of the carry multiplexers C1 and C2. Multiplexers L1 and L2 can be set to provide a constant value stored in memory cells 5 and 6. The value stored in cell 5 or 6 can cause carry multiplexers C1 and C2 to select the output of multiplexers N1 and N2. When multiplexers N1 and N2 are set to provide a constant value 1 from cells 3 and 4, carry multiplexers C1 and C2 provide the OR function of the carry-in signal and the value from multiplexers L1 and L2. When multiplexers N1 and N2 are set to provide a constant value 0 from cells 3 and 4, carry multiplexers C1 and C2 provide the AND function of the carry-in signal and the value from multiplexers L1 and L2. Thus wide AND or wide OR functions can easily be generated. Multiplexers M1 and M2 select one of the input signals to the F and G function generators to apply as an input signal to multiplexers N1 and N2 respectively. Memory cells 7 and 9 control multiplexer M1 and memory cells 8 and 10 control multiplexer M2. Thus the functions listed above in TABLE I can be generated by the structure of FIG. 10 while other functions are being simultaneously generated in the F and G function generators.

It can be seen in FIG. 10 that multiplexers L1 and L2 allow carry multiplexers C1 and C2 to be used for skipping and initialization while the function generators are used for other purposes. Multiplexers N1 and N2 allow initialization and logic functions without using up one of the function generator input signals and the routing thereto (not shown, positioned to the left of the figure, for example).

Another embodiment similar to FIG. 10 includes a fifth input to the structure comprising multiplexers M1 and N1 (and their equivalents M2 and N2). If desired, the fifth signal is provided as the output of N1. This embodiment has the advantage that the functions of TABLE I can be implemented while the related function generator F is able to simultaneously implement any function of the four input signals F0–F3 which it receives.

Applications of the Circuit of FIG. 10

TABLE I lists functions which can be implemented with the circuit of FIG. 8c. In FIG. 10, multiplexers M1 and M2 also allow for selection from four function generator input signals F0–F3 and G0–G3 to provide as input to the carry multiplexers C1 and C2. Multiplexers M1 and M2 allow lines FB and GB of FIG. 9B to be eliminated. Depending upon layout, this may save chip area. In any case, multiplexers M1 and M2 increase flexibility by allowing any of signals F0–F3 and G0–G3 to be used as carry input signals.

By setting multiplexers so that carry multiplexer C1 receives one of the input signals F0–F3, it is possible to gang the carry input signal from another part of the integrated circuit chip.

Providing multiplexers N1 and N2 in the path from the function generator input signals F0–F3 and G0–G3 allows a carry signal to be initiated (with a fixed value) without using up the related function generator.

Dynamically Switchable Difference/Identity Comparator

Users sometimes want to dynamically switch between having a difference comparator and having an identity comparator. In a difference comparator, if a 3 is compared to a 2, the difference 3–2 is positive. The subtraction is accomplished by inverting one input and adding, which is accomplished by an XOR gate with one inverted input for each bit of the subtraction.

Figure 11:
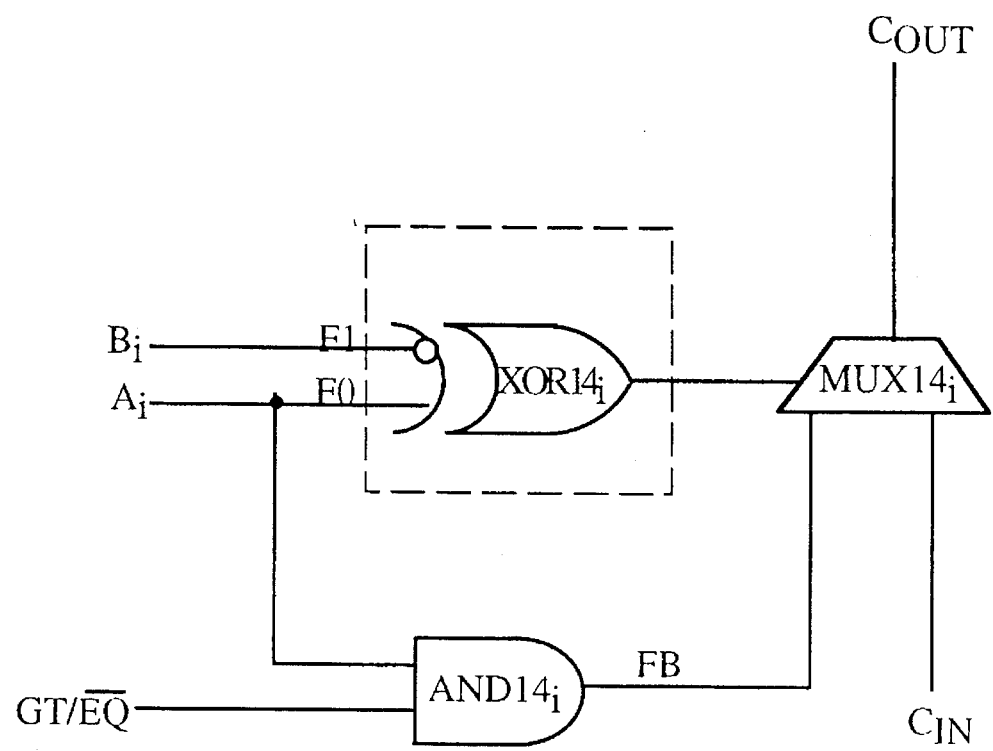
FIG. 11 shows a dynamically switchable comparator circuit which may be implemented by the circuit of FIG. 9b or FIG. 10.

FIG. 11 shows a circuit which a user may want to implement that dynamically switches between being a difference comparator and being an identity comparator. This circuit is efficiently implemented by the structure of either FIG. 9b or FIG. 10 plus one outside AND gate. To subtract two numbers A–B, the GT/$\overline{EQ}$ signal is set to logic 1 and a logic 1 is provided on the lowest order carry-in terminal $C_{in}$. Thus for each bit $A_i$ and $B_i$ of two numbers A and B, AND gate AND14$_i$ forwards $A_i$. Thus FB=$A_i$ (FIG. 9b) or F3=$A_i$ (FIG. 10), and what we have is subtraction. The result of the carry chain output from the highest-order bit determines which input was greater.

To determine if two numbers A and B are equal, GT/$\overline{EQ}$ is set to 0, which causes the carry chain to do a bit-by-bit comparison and create the AND of the individual bits. Only if all bits are equal is the output a 1. So the external AND gate lets you switch between the two functions by providing $A_i$ or 0 to the zero input of multiplexer MUX14$_i$. Since the function changes in response to the input signal GT/$\overline{EQ}$ it is easy for a user to dynamically change between the subtraction and identity functions by changing this signal.

The circuit of FIG. 11 can be implemented in the architecture of FIG. 9b by providing one AND gate for each bit to implement AND gate AND14$_i$ in a function generator not shown, for example in function generators to the left of function generators F, G, H, and J and applying the outputs of these AND gates to lines FB, GB, HB, and JB as well as to additional function generators not shown which may be above or below those shown in FIG. 9b for additional bits in the numbers A and B being compared. Bits of the two numbers A and B are then applied to the F0 and F1 input terminals of the F, G, H, and J function generators, which are programmed to provide the XOR function with the F1, G1, H1, and J1 inputs inverted. Multiplexers C1, C2, C3, and C4 plus equivalent multiplexers in adjacent logic blocks are programmed to be controlled by the output signals of the F, G, H, and J function generators. Thus the circuit of FIG. 11 is implemented, and the function of the circuit is determined by the GT/$\overline{EQ}$ signal.

Implementation of FIG. 11 in the circuit of FIG. 10 is similar to implementation in the circuit of FIG. 9b. In FIG. 10, the output of AND gates 14$_i$ are provided to one of the function generator inputs, say F3 and G3, and multiplexers M1 and M2 are set to forward that signal to multiplexers N1 and N2, which provide the signal to carry multiplexers C1 and C2.

Embodiment for Fast Loadable Counter

Figure 12:
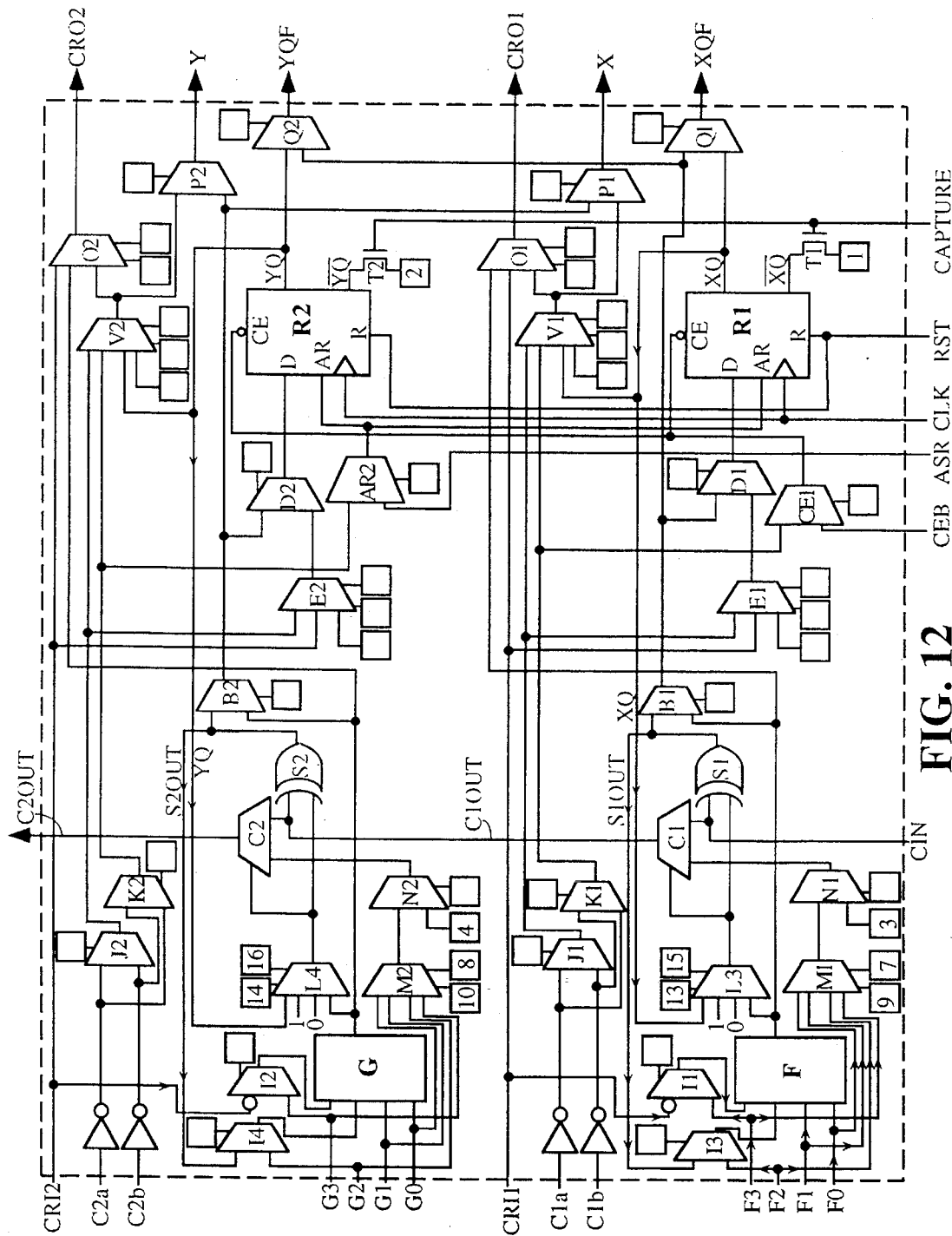
FIG. 12 shows an embodiment of the invention having the structure illustrated in FIG. 8d.

FIG. 12 shows a structure having the features discussed in connection with FIG. 8d. As with FIG. 10, the embodiment of FIG. 12 includes two function generators F and G and two flip flops R1 and R2. Elements having the same function as in FIG. 10 are given the same reference numerals. Because FIG. 12 includes input multiplexers I1, I2, I3, and I4, the propagate enable multiplexers PE1 and PE2 and the related propagate enable signal line PE can be eliminated. Thus in FIG. 12, multiplexers D1 and D2 are controlled by memory cells having static values. Dynamic control of the value in flip flops R1 and R2 is provided by the F and G function generators as discussed above in connection with FIG. 8d. Multiplexer 924 of FIG. 8d is implemented twice in each stage of FIG. 12 as multiplexers I1 and I3 for providing input to the F function generator and multiplexers I2 and I4 for providing input to the G function generator. Multiplexer L3 controlled by memory cells 13 and 15 and multiplexer L4 controlled by memory cells 14 and 16 correspond to multiplexer 814 of FIG. 8d. Multiplexers B1 and D1 of FIG. 12 correspond to multiplexer 928 of FIG. 8d. Likewise, multiplexers B2 and D2 of FIG. 12 correspond to multiplexer 928 of FIG. 8d. Since the operation of the structure of FIG. 8d has been discussed in detail, the operation of FIG. 12 can be understood and is not repeated. Many variations on the structure of FIG. 12 are possible and can achieve advantages similar to the illustrated structures.

SUMMARY

Several embodiments of the invention have been described in detail in connection with FIGS. 8d, 8e, 8f, 9a, 9b, 10 and and 12. Other embodiments of the present invention incorporating the features taught here will become obvious to those skilled in the art in light of the above disclosure. For example, it is possible to interconnect logic blocks which are not contiguous. Further, although FIGS. 9a and 9b show a logic block having four stages of carry logic and four function generators, and FIG. 10 shows a logic block having two stages of carry and other logic and two function generators, it is possible to form logic blocks having other numbers of stages and other hardware for generating common functions.

For another example, although the control circuitry of FIGS. 9a and 9b are described as controlled by memory cells, it is obvious that these memory cells can be SRAM memory cells, EPROMS, EEPROMS, flash memory cells, fuses, or antifuses. It is also obvious that control signals can be provided by output signals of logic gates and other available signals. These embodiments and others which become obvious in light of the above disclosure are intended to fall within the scope of the present invention.

We claim:

1. A programmable logic device comprising a sequence of logic blocks, each logic block having at least one circuit comprising:

an input terminal for providing an input signal ($A_i$ or $Al_i$);

a ripple-in terminal ($C_i$) and a ripple-out terminal ($C_{i+1}$);

a ripple-chain multiplexer (923) for connecting one of said input terminal and said ripple-in terminal to said ripple-out terminal;

a function generator (903) for generating a function generator output signal which is a function of said first input signal and at least one other input signal;

a flip flop (929) providing a Q output signal;

means (928 or wire) for providing said function to said flip flop; and means (814 or wire) for providing a control signal ($P_i$) for controlling said ripple-chain multiplexer, said control signal being selected from at least said Q output signal.

2. A programmable logic device as in claim 1 in which said means for providing a control signal ($P_i$) for controlling said ripple-chain multiplexer is a control multiplexer, said control multiplexer receiving input signals from at least said Q output signal and said function generator.

3. A programmable logic device as in claim 1 in which said means (928) for providing said function to said flip flop comprises at least one multiplexer (928) which receives on one of its input terminals said function of said first input signal and at least one other input signal;

and further comprising:

an XOR gate (926) connected to receive said control multiplexer output signal ($P_i$) and a signal on said ripple-in terminal ($C_i$) which generates a sum output signal ($S_i$), said at least one multiplexer (928) which receives on one of its input terminals said function of said first input signal and at least one other input signal also receives on another input terminal said control multiplexer output signal ($P_i$); and an input multiplexer (924) which provides to said function generator said at least one other input signal, said input multiplexer being connected to alternatively provide to said function generator said sum output signal.

* * * * *

UNITED STATES PATENT AND TRADEMARK OFFICE
CERTIFICATE OF CORRECTION

PATENT NO. : 5,546,018

DATED : August 13, 1996

INVENTOR(S) : Bernard J. New and Steven P. Young

It is certified that error appears in the above-identified patent and that said Letters Patent is hereby corrected as shown below:

Col. 3, line 7, "$P_3 \cdot P_2 + P_1 \cdot C_1$" should read --$P_3 \cdot P_2 \cdot P_1 \cdot C_1$--.

Col. 7, line 38, "$\overline{F}_i$" should read --$\overline{F_i}$--.

Col. 7, line 43, "$\overline{F}_i$" should read --$\overline{F_i}$--.

Copl. 15, line 10, "$Al_i$" should read --$A1_i$--.

Signed and Sealed this

Sixteenth Day of December, 1997

Attest:

BRUCE LEHMAN

*Attesting Officer*  *Commissioner of Patents and Trademarks*